(12) United States Patent
Youn et al.

(10) Patent No.: US 11,825,693 B2
(45) Date of Patent: Nov. 21, 2023

(54) TRANSPARENT DISPLAY DEVICE

(71) Applicant: LG Display Co., Ltd., Seoul (KR)

(72) Inventors: Jun-Ho Youn, Paju-si (KR); Heume-Il Baek, Paju-si (KR)

(73) Assignee: LG DISPLAY CO., LTD., Seoul (KR)

( * ) Notice: Subject to any disclaimer, the term of this patent is extended or adjusted under 35 U.S.C. 154(b) by 211 days.

(21) Appl. No.: 17/513,511

(22) Filed: Oct. 28, 2021

(65) Prior Publication Data

US 2022/0181395 A1 Jun. 9, 2022

(30) Foreign Application Priority Data

Dec. 8, 2020 (KR) .................. 10-2020-0170668

(51) Int. Cl.
*H01L 29/08* (2006.01)
*H10K 59/121* (2023.01)
*H10K 50/11* (2023.01)
*H10K 50/805* (2023.01)

(52) U.S. Cl.
CPC .......... *H10K 59/121* (2023.02); *H10K 50/11* (2023.02); *H10K 50/805* (2023.02)

(58) Field of Classification Search
CPC ..... H10K 59/121; H10K 50/805; H10K 50/11

USPC ............................................................. 257/40
See application file for complete search history.

(56) References Cited

U.S. PATENT DOCUMENTS

2019/0181345 A1* 6/2019 Hwang .................. H10K 71/00
2019/0189711 A1* 6/2019 Ryoo ..................... H10K 50/82

FOREIGN PATENT DOCUMENTS

KR 10-2019-0068309 A 6/2019

* cited by examiner

*Primary Examiner* — Phuc T Dang
(74) *Attorney, Agent, or Firm* — Birch, Stewart, Kolasch & Birch, LLP

(57) ABSTRACT

A transparent display device includes a substrate on which a pixel including an emission area and a first transparent area is defined, and a light-emitting diode provided in the emission area and including a first electrode, a light-emitting layer, and a second electrode. The transparent display device further includes an anti-deposition layer provided in the first transparent area. The height of the light-emitting layer at an edge area of the emission area is higher than the height of the light-emitting layer at a center area of the emission area. Further, the second electrode is disposed over the entire surface excluding the first transparent area, and the height of the anti-deposition layer at an edge area of the first transparent area is higher than the height of the anti-deposition layer at a center area of the first transparent area.

19 Claims, 21 Drawing Sheets

TRANSPARENT DISPLAY DEVICE

CROSS-REFERENCE TO RELATED APPLICATIONS

The present application claims priority under 35 U.S.C. § 119(a) to Patent Application No. 10-2020-0170668 filed in the Republic of Korea on Dec. 8, 2020, the entire contents of which are hereby expressly incorporated by reference into the present application.

BACKGROUND

Field of the Disclosure

The present disclosure relates to a display device, and more particularly, to a transparent display device having an emission area and a transparent area.

Discussion of the Related Art

As one of the flat panel display devices, an electroluminescent display device has wide viewing angles as compared with a liquid crystal display device because it is self-luminous and also has advantages of a thin thickness, light weight and low power consumption since a backlight unit is not necessary.

In addition, the electroluminescent display device is driven by low voltages of direct current (DC) and has a fast response time. Further, the electroluminescent display device is strong against the external impacts and is used in a wide range of temperatures because its components are solids. In addition, the electroluminescent display device can be manufactured at low costs.

Recently, a transparent display device using an electroluminescent display device has been widely developed. The transparent display device is a display device in which backgrounds behind a screen are visible. Therefore, image information and the surrounding environment can be displayed together.

The transparent display device using an electroluminescent display device includes a plurality of pixels, each of which has a plurality of emission areas. By selectively driving the plurality of emission areas, various color images can be displayed.

In such a transparent display device, light-emitting layers are provided in the respective emission areas, and each light-emitting layer is formed through a vacuum thermal evaporation process in which a luminescent material is selectively deposited using a fine metal mask (FMM).

In the transparent display device using an electroluminescent display device, however, since the size of the emission area is relatively small, it is not easy to form the light-emitting layer through the evaporation process.

In addition, the evaporation process can increase manufacturing costs due to the preparation of the mask and can have a limitation in application to a large-sized and high-definition display device possibly due to manufacturing variations, sagging, shadow effect of the mask, and the like.

SUMMARY OF THE DISCLOSURE

Accordingly, the present disclosure is directed to a transparent display device that substantially obviates one or more of the problems due to limitations and disadvantages of the related art.

An object of the present disclosure is to provide an improved transparent display device having a large size and a high definition.

Additional features and advantages of the present disclosure will be set forth in the description which follows, and in part will be apparent from the description, or can be learned by practice of the present disclosure. The objectives and other advantages of the present disclosure will be realized and attained by the structure particularly pointed out in the written description and claims hereof as well as the appended drawings.

To achieve these and other advantages and in accordance with the purpose of the present disclosure, as embodied and broadly described herein, there is provided a transparent display device that includes a substrate on which a pixel including an emission area and a first transparent area is defined, a light-emitting diode provided in the emission area and including a first electrode, a light-emitting layer, and a second electrode, and an anti-deposition layer provided in the first transparent area, wherein a height of the light-emitting layer at an edge area (e.g., edge) of the emission area is higher than a height of the light-emitting layer at a center area (e.g., center) of the emission area, wherein the second electrode is disposed over an entire surface of the substrate excluding the first transparent area, and wherein a height of the anti-deposition layer at an edge area (e.g., edge) of the first transparent area is higher than a height of the anti-deposition layer at a center area (e.g., center) of the first transparent area.

It is to be understood that both the foregoing general description and the following detailed description are by example and explanatory and are intended to provide further explanation of the present disclosure as claimed.

BRIEF DESCRIPTION OF THE DRAWINGS

The accompanying drawings, which are included to provide a further understanding of the present disclosure and which are incorporated in and constitute a part of this specification, illustrate an embodiment of the present disclosure and together with the description serve to explain the principles of the present disclosure.

DETAILED DESCRIPTION OF THE EMBODIMENTS

Reference will now be made in detail to exemplary embodiments of the disclosure, examples of which are illustrated in the accompanying drawings. All the components of each transparent display device according to all embodiments of the present disclosure are operatively coupled and configured.

A transparent display device according to an embodiment of the present disclosure displays an image using an electroluminescent display device. The transparent display device using an electroluminescent display device includes a plurality of pixels to display an image, and each of the plurality of pixels includes first, second, and third sub-pixels. The first, second, and third sub-pixels can have a configuration shown in FIG. 1.

Figure 1:
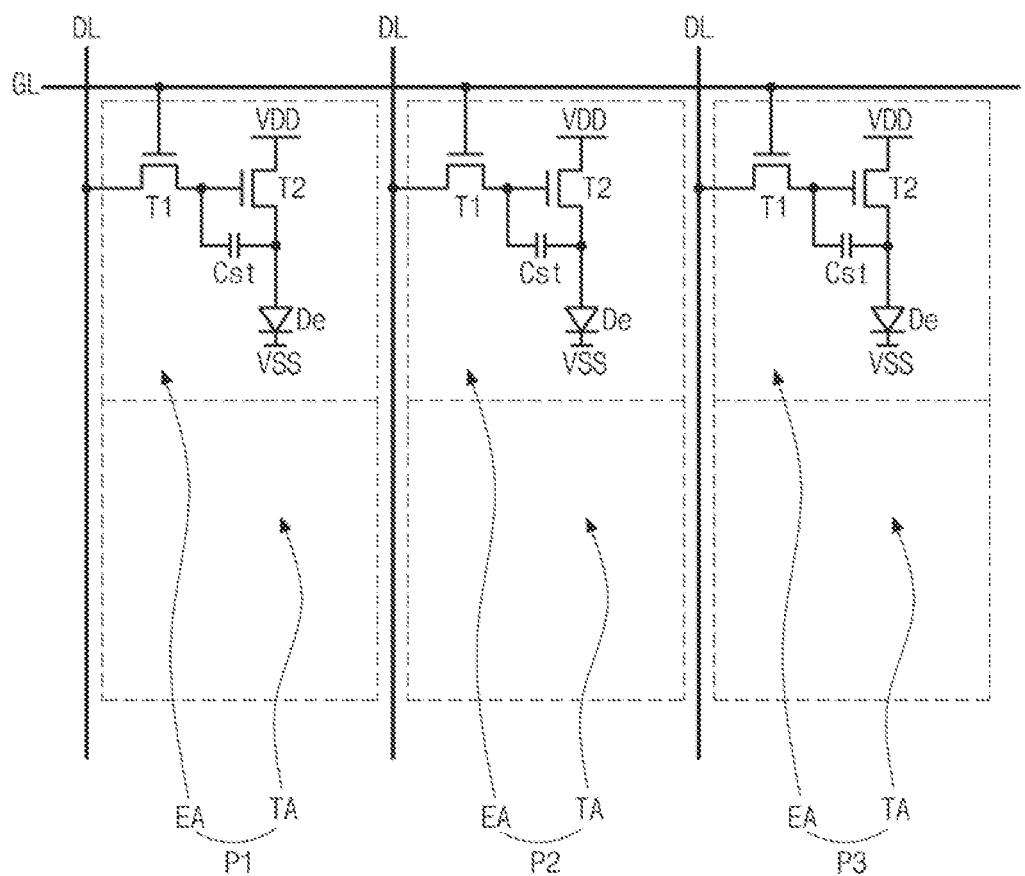
FIG. 1 is a circuit diagram of one pixel of a transparent display device according to an embodiment of the present disclosure.

FIG. 1 is a circuit diagram of one pixel of a transparent display device according to an embodiment of the present disclosure.

In FIG. 1, the transparent display device according to the embodiment of the present disclosure includes a plurality of gate lines and a plurality of data lines crossing each other to define sub-pixels. Particularly, in the example of FIG. 1, a gate line GL and data lines DL cross each other to define first, second, and third sub-pixels P1, P2, and P3. Each of the first, second, and third sub-pixels P1, P2, and P3 includes an emission area EA and a transparent area TA. Accordingly, one pixel can include three emission areas EA and three transparent areas TA, but other variations are possible.

Alternatively, the transparent areas TA of the first, second, and third sub-pixels P1, P2, and P3 can be connected to each other and provided as one body. For example, one pixel can include three emission areas EA and one transparent area TA, but is not limited thereto. For example, the first, second, and third sub-pixels P1, P2, and P3 can be red, green, and blue sub-pixels, respectively.

The transparent display device according to the embodiment of the present disclosure shows together the surrounding environment information such as backgrounds through the transparent areas TA while displaying the image information through the emission areas EA.

A switching thin film transistor T1, a driving thin film transistor T2, a storage capacitor Cst, and a light-emitting diode De are formed in the emission area EA of each of the first, second, and third sub-pixels P1, P2, and P3.

More specifically, the gate line GL extends in a horizontal direction, and the data lines DL extend in a vertical direction. The first, second, and third sub-pixels P1, P2, and P3 are sequentially arranged along the horizontal direction. The emission area EA and the transparent area TA of each sub-pixel P1, P2, and P3 can be arranged along the vertical direction.

In the emission area EA of each sub-pixel P1, P2, and P3, a gate electrode of the switching thin film transistor T1 is connected to the gate line GL and a source electrode of the switching thin film transistor T1 is connected to the data line DL. A gate electrode of the driving thin film transistor T2 is connected to a drain electrode of the switching thin film transistor T1 and a source electrode of the driving thin film transistor T2 is connected to a high voltage supply VDD. An anode of the light-emitting diode De is connected to a drain electrode of the driving thin film transistor T2, and a cathode of the light-emitting diode De is connected to a low voltage supply VSS. The storage capacitor Cst is connected to the gate electrode and the drain electrode of the driving thin film transistor T2.

The transparent display device using an electroluminescent display device is driven to display an image. For example, when the switching thin film transistor T1 is turned on by a gate signal applied through the gate line GL, a data signal from the data line DL is applied to the gate electrode of the driving thin film transistor T2 and an electrode of the storage capacitor Cst through the switching thin film transistor T1.

When the driving thin film transistor T2 is turned on by the data signal, an electric current flowing through the light-emitting diode De is controlled, thereby displaying an image. The light-emitting diode De emits light due to the current supplied through the driving thin film transistor T2 from the high voltage supply VDD.

Namely, the amount of the current flowing through the light-emitting diode De is proportional to the magnitude of the data signal, and the intensity of light emitted by the light-emitting diode De is proportional to the amount of the current flowing through the light-emitting diode De. Thus, the first, second, and third sub-pixels P1, P2, and P3 show different gray levels depending on the magnitude of the data signal, and as a result, the transparent display device displays an image.

In addition, the storage capacitor Cst maintains charges corresponding to the data signal for a frame when the switching thin film transistor T1 is turned off. Accordingly, even if the switching thin film transistor T1 is turned off, the storage capacitor Cst allows the amount of the current flowing through the light-emitting diode De to be constant and the gray level shown by the light-emitting diode De to be maintained until a next frame.

Meanwhile, one or more thin film transistors and/or capacitors can be added in each sub-pixel P1, P2, and P3 in addition to the switching and driving thin film transistors T1 and T2 and the storage capacitor Cst.

For example, in the transparent display device using an electroluminescent display device, the driving thin film transistor T2 is turned on for a relatively long time while the data signal is applied to the gate electrode of the driving thin film transistor T2 and the light-emitting diode De emits light to thereby display the gray level. The driving thin film transistor T2 can deteriorate due to application of the data signal for a long time. Therefore, the mobility and/or threshold voltage Vth of the driving thin film transistor T2 are changed, and thus the each sub-pixel P1, P2, and P3 displays a different gray level with respect to the same data signal. This causes non-uniform luminance, thereby lowering the image quality of the display device.

Accordingly, to compensate the change of the mobility and/or threshold voltage of the driving thin film transistor T2, at least one sensing thin film transistor and/or capacitor for sensing a voltage change can be further added in each sub-pixel P1, P2, and P3. The sensing thin film transistor and/or capacitor can be connected to a reference line for applying a reference voltage and outputting a sensing voltage.

The transparent display device can be classified into a bottom emission type and a top emission type according to an emission direction of the electroluminescent display device used therefor. In the bottom emission type display device, light from the light-emitting diode De is output toward a substrate on which the thin film transistors T1 and T2 are formed through the anode, and in the top emission type display device, light from the light-emitting diode De is output toward a direction opposite the substrate through the cathode. In general, since the thin film transistors T1 and T2 are formed under the light-emitting diode De in the electroluminescent display device, the size of an effective emission area may be limited due to the thin film transistors T1 and T2 in the bottom emission type display device, and the top emission type display device has the larger effective emission area than the bottom emission type display device. Therefore, the top emission type display device can have a higher aperture ratio than the bottom emission type display device, so that the top emission type display device is widely used for a display device with a large size and a high definition.

Since the cathode is mostly formed of a metal material, the cathode can be formed to a relatively thin thickness in the top emission type display device such that light is output through the cathode. Accordingly, the resistance of the cathode may increase, and a VSS voltage drop may occur due to the resistance of the cathode in the display device with a large size and a high definition, which can cause a non-uniform brightness. Therefore, the transparent display device according to the embodiment of the present disclosure has a structure for lowering the resistance of the cathode.

In addition, the cathode is formed substantially over the entire surface of the substrate of the display device. Thus, in the transparent display device of the present disclosure, the cathode can be disposed in the transparent area TA as well as in the emission area EA. However, when the cathode formed of a metal material is disposed in the transparent area TA, the transmittance of the transparent TA can decrease. Accordingly, in the present disclosure, the cathode is not formed in the transparent area TA.

Figure 2:
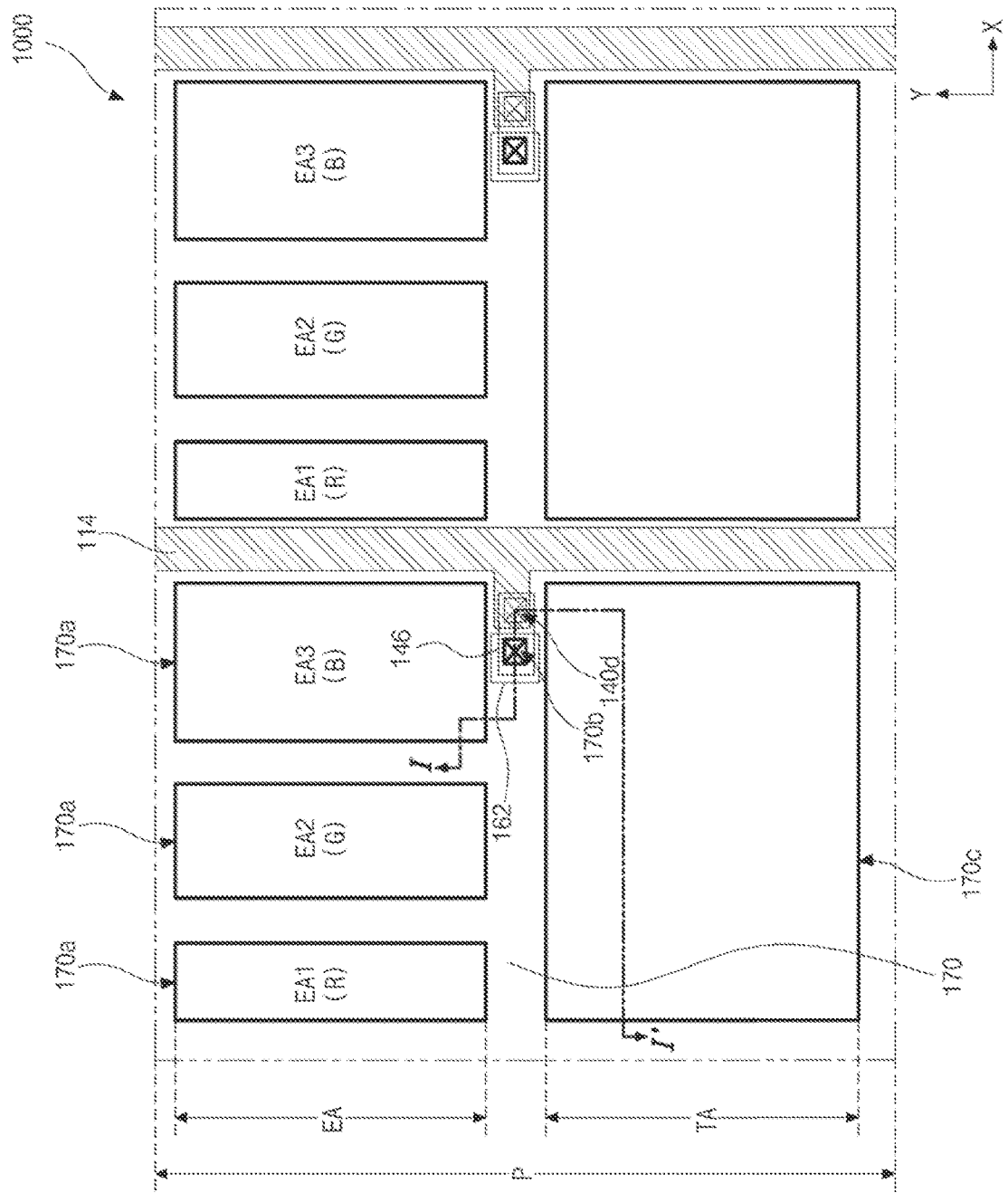
FIG. 2 is a schematic plan view of a transparent display device according to a first embodiment of the present disclosure.

FIG. 2 is a schematic plan view of a transparent display device according to a first embodiment of the present disclosure and mainly shows a bank configuration.

As shown in FIG. 2, a transparent display device 1000 according to the first embodiment of the present disclosure includes a plurality of pixels P configured to display images. Here, each pixel P can include an emission area EA and a transparent area TA. In one example, each pixel P can include three emission areas EA and one transparent area TA, and each of the emission areas EA has substantially the same configuration except for the sizes.

More particularly, the pixel P includes first, second, and third sub-pixels, for example, red, green, and blue sub-pixels. Each of the red, green, and blue sub-pixels can include the emission area EA and the transparent area TA. At this time, the emission area EA can include first, second, and third emission areas EA1, EA2, and EA3 corresponding to the red, green, and blue sub-pixels, respectively. In addition, the transparent area TA of each of the red, green, and blue sub-pixels can be connected to each other and formed as one body. Alternatively, the transparent area TA can be separated for each of the red, green, and blue sub-pixels.

The emission area EA and the transparent area TA are arranged along a Y direction (e.g., vertical direction) in the context of the figure, and the first, second, and third emission areas EA1, EA2, and EA3 are arranged along an X direction (e.g., horizontal direction) perpendicular to the Y direction. Here, the Y direction can be defined as a first direction, and the X direction can be defined as a second direction. Alternatively, the X direction can be defined as a first direction, and the Y direction can be defined as a second direction.

Here, the first, second, and third emission areas EA1, EA2, and EA3 can have different sizes. For example, the size of the second emission area EA2 of the green sub-pixel can be larger than the size of the first emission area EA1 of the red sub-pixel and smaller than the size of the third emission area EA3 of the blue sub-pixel, but is not limited thereto. In this case, the first, second, and third emission areas EA1, EA2, and EA3 can have the same length along the Y direction and different widths along the X direction, but is not limited thereto.

Since light-emitting diodes provided at respective sub-pixels are formed of light-emitting materials having different properties, the light-emitting diodes have different lifetimes and efficiencies, and the lifetime of the display device can be lowered due to the difference in the lifetimes of the light-emitting diodes. Accordingly, in the present disclosure, by differentiating the sizes of the first, second, and third emission areas EA1, EA2, and EA3 of the red, green, and blue sub-pixels, the lifetimes and efficiencies of the light-emitting diodes provided at respective sub-pixels can be optimized, thereby addressing the limitation of the lifetime of the display device being lowered and thus improving the lifetime of the display device.

A bank 170 is formed between adjacent ones of the first, second, and third emission areas EA1, EA2, and EA3 and between the emission area EA and the transparent area TA. The bank 170 has a first opening 170a corresponding to each of the first, second, and third emission areas EA1, EA2, and EA3 and a second opening 170c corresponding to the transparent area TA.

Here, the second opening 170c is formed as a single opening corresponding to the transparent areas TA of the red, green, and blue sub-pixels. Alternatively, the second opening 170c can be divided into and separately formed for the red, green, and blue sub-pixels.

Each of the first and second openings 170a and 170c is illustrated as having a rectangular shape, but is not limited thereto. Each of the first and second openings 170a and 170c can have various shapes such as a rectangular shape with rounded corners, an oval shape, or the like.

Meanwhile, first and second auxiliary electrodes 114 and 146 and a connection pattern 162 are formed under the bank 170.

The first auxiliary electrode 114 can be provided as a line shape extending along the Y direction, and one first auxiliary electrode 114 can be disposed between adjacent pixels P along the X direction.

The second auxiliary electrode 146 is disposed between the emission area EA and the transparent area TA and partially overlaps the first auxiliary electrode 114. The second auxiliary electrode 146 is connected to the first auxiliary electrode 114 through a contact hole 140d.

Here, the first auxiliary electrode 114 can include a protrusion part between the emission area EA and the transparent area TA, and the second auxiliary electrode 146 can overlap the protrusion part of the first auxiliary electrode 114. However, the present disclosure is not limited.

In addition, the connection pattern 162 is disposed between the emission area EA and the transparent area TA and partially overlaps the second auxiliary electrode 146. The bank 170 has an auxiliary contact hole 170b corresponding to the connection pattern 162. The connection pattern 162 is connected to the second auxiliary electrode 146 through a contact hole under the auxiliary contact hole 170b.

Meanwhile, although not shown in the figure, a first electrode is formed of the same material as the connection pattern 162 in each of the first, second, and third emission areas EA1, EA2, and EA3, and the first electrode is exposed through the first opening 170a. A light-emitting layer is formed on the exposed first electrode, and a second electrode is formed on the light-emitting layer. The first electrode, the light-emitting layer, and the second electrode constitute a light-emitting diode. The first electrode serves as an anode, and the second electrode serves as a cathode.

At this time, the second electrode is formed substantially over the entire surface of the substrate excluding the transparent area TA, and is electrically connected to the connection pattern 162 thereunder through the auxiliary contact hole 170b. The second electrode is also electrically connected to the first and second auxiliary electrodes 114 and 146 through the connection pattern 162, and thus the resistance of the second electrode, for example, the resistance of the cathode can be decreased.

Meanwhile, An anti-deposition layer is formed in the transparent area TA, thereby preventing the second electrode from being deposited. Accordingly, the second electrode is not disposed in the transparent area TA, so that the transmittance of the transparent area TA can be increased.

A cross-sectional structure of the transparent display device 1000 according to the first embodiment of the present disclosure will be described in detail with reference to FIG. 3.

Figure 3:
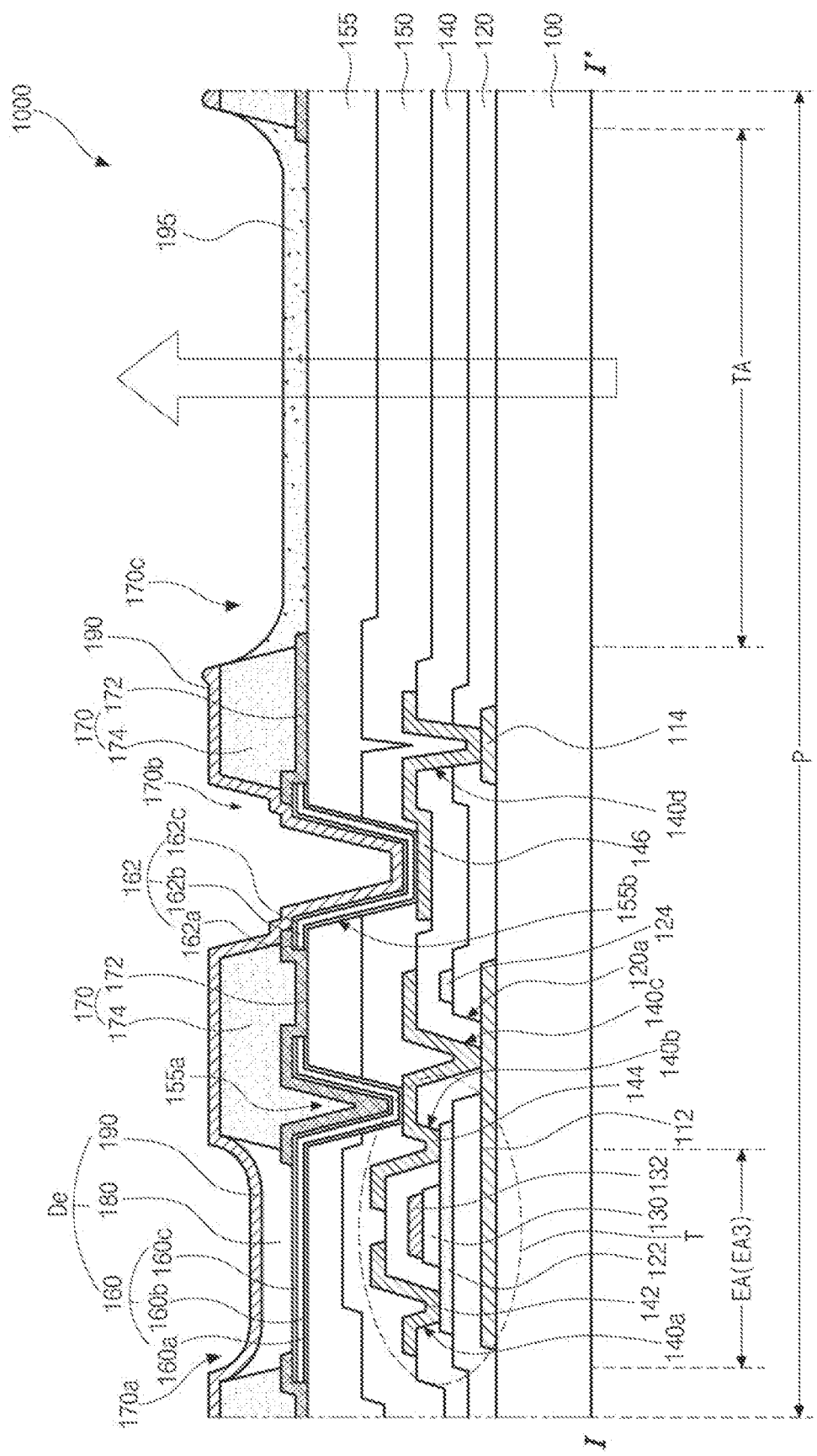
FIG. 3 is a schematic cross-sectional view of the transparent display device according to the first embodiment of the present disclosure and corresponds to the line I-I' of FIG. 2.

FIG. 3 is a schematic cross-sectional view of the transparent display device according to the first embodiment of the present disclosure and corresponds to the line I-I' of FIG. 2.

As shown in FIG. 3, in the transparent display device 1000 according to the first embodiment of the present disclosure, a plurality of pixels P each including an emission area EA and a transparent area TA are defined on a substrate 100. A light-blocking pattern 112 and a first auxiliary electrode 114 of a first conductive material such as metal are formed on the substrate 100. Here, at least a part of the light-blocking pattern 112 can be disposed in the emission area EA, and at least a part of the first auxiliary electrode 114 can be disposed between the emission area EA and the transparent area TA.

The substrate 100 can be a glass substrate or a plastic substrate. For example, polyimide can be used for the plastic substrate, but is not limited thereto.

The light-blocking pattern 112 and the first auxiliary electrode 114 can be formed of at least one of aluminum (Al), copper (Cu), molybdenum (Mo), titanium (Ti), chromium (Cr), nickel (Ni), tungsten (W) or an alloy thereof and can have a single-layered structure or a multi-layered structure. For example, the light-blocking pattern 112 and the first auxiliary electrode 114 can have a double-layered structure including a lower layer of a molybdenum-titanium alloy (MoTi) and an upper layer of copper (Cu), and the upper layer can have a thicker thickness than the lower layer.

A buffer layer 120 is formed on the light-blocking pattern 112 and the first auxiliary electrode 114 substantially on an entire surface of the substrate 100. The buffer layer 120 can be formed of an inorganic insulating material such as silicon oxide ($SiO_2$) or silicon nitride (SiNx) and can be formed as a single layer or multi layers.

Here, the buffer layer 120 has a buffer hole 120a on the light-blocking pattern 112, and a top surface of the light-blocking pattern 112 is partially exposed through the buffer hole 120a.

A semiconductor layer 122 and a capacitor electrode 124 are patterned and formed on the buffer layer 120. The semiconductor layer 122 and the capacitor electrode 124 are spaced apart from each other over the light-blocking pattern 112. The light-blocking pattern 112 blocks light incident on the semiconductor layer 122 and prevents the semiconductor layer 122 from deteriorating due to the light.

The semiconductor layer 122 and the capacitor electrode 124 can be formed of polycrystalline silicon, and in this case, both ends of the semiconductor layer 122 and the capacitor electrode 124 can be doped with impurities. Alternatively, the semiconductor layer 122 and the capacitor electrode 124 can be formed of an oxide semiconductor material.

A gate insulation layer 130 of an insulating material and a gate electrode 132 of a second conductive material such as metal are sequentially formed on the semiconductor layer 122. The gate insulation layer 130 and the gate electrode 132 are disposed to correspond to a center of the semiconductor layer 122.

The gate insulation layer 130 can be formed of an inorganic insulating material such as silicon oxide ($SiO_2$) or silicon nitride (SiNx). When the semiconductor layer 122 is made of an oxide semiconductor material, it is preferable that the gate insulation layer 130 is formed of silicon oxide ($SiO_2$). Alternatively, when the semiconductor layer 122 is made of polycrystalline silicon, the gate insulation layer 130 can be formed of silicon oxide ($SiO_2$) or silicon nitride (SiNx).

The gate electrode 132 can be formed of at least one of aluminum (Al), copper (Cu), molybdenum (Mo), titanium (Ti), chromium (Cr), nickel (Ni), tungsten (W) or an alloy thereof and can have a single-layered structure or a multi-layered structure. For example, the gate electrode 132 can have a double-layered structure including a lower layer of a molybdenum-titanium alloy (MoTi) and an upper layer of copper (Cu), and the upper layer can have a thicker thickness than the lower layer.

As shown in the figure, the gate insulation layer 130 can be patterned to have substantially the same shape as the gate electrode 132. At this time, a width of the gate insulation layer 130 can be wider than a width of the gate electrode 132, and thus, edges of a top surface of the gate insulation layer 130 can be exposed. Alternatively, the width of the gate insulation layer 130 can be the same as the width of the gate electrode 132.

Otherwise, the gate insulation layer 130 may not be patterned and can be formed substantially over the entire surface of the substrate 100.

Meanwhile, a gate line can be further formed of the same material and on the same layer as the gate electrode 132.

An interlayer insulation layer 140 made of an insulating material is formed on the gate electrode 132 substantially over the entire surface of the substrate 100. The interlayer insulation layer 140 can be formed of an inorganic insulating material such as silicon oxide ($SiO_2$) or silicon nitride (SiNx). Alternatively, the interlayer insulation layer 140 can be formed of an organic insulating material such as photo acryl or benzocyclobutene.

The interlayer insulation layer 140 has first, second, third, and fourth contact holes 140a, 140b, 140c, and 140d. The first and second contact holes 140a and 140b expose the both ends of the semiconductor layer 122, respectively. The third contact hole 140c partially exposes the top surface of the light-blocking pattern 112 and is located in the buffer hole 120a. Alternatively, the buffer hole 120a can be omitted, and the third contact hole 140c can be formed in the buffer layer 120 as well as in the interlayer insulation layer 140 to partially expose the top surface of the light-blocking pattern 112. The fourth contact hole 140d is formed in the buffer layer 120 as well as in the interlayer insulation layer 140 to partially expose a top surface of the first auxiliary electrode 114.

Source and drain electrodes 142 and 144 and a second auxiliary electrode 146 made of a third conductive material such as metal are formed on the interlayer insulation layer 140. The source and drain electrodes 142 and 144 and the second auxiliary electrode 146 can be formed of at least one of aluminum (Al), copper (Cu), molybdenum (Mo), titanium (Ti), chromium (Cr), nickel (Ni), tungsten (W) or an alloy thereof and can have a single-layered structure or a multi-layered structure. For example, the source and drain electrodes 142 and 144 and the second auxiliary electrode 146 can have a double-layered structure including a lower layer of a molybdenum-titanium alloy (MoTi) and an upper layer of copper (Cu), and the upper layer can have a thicker thickness than the lower layer. Alternatively, the source and drain electrodes 142 and 144 and the second auxiliary electrode 146 can have a triple-layered structure.

The source and drain electrodes 142 and 144 contact the both ends of the semiconductor layer 122 through the first and second contact holes 140a and 140b, respectively. Further, the drain electrode 144 contacts the light-blocking pattern 112 through the third contact hole 140c and overlaps the capacitor electrode 124. The capacitor electrode 124 overlaps the light-blocking pattern 112 and the drain electrode 144 to form a storage capacitor.

Meanwhile, the second auxiliary electrode 146 contacts the first auxiliary electrode 114 through the fourth contact hole 140d.

In addition, a data line and a high voltage supply line can be further formed on the interlayer insulation layer 140 and can be made of the third conductive material.

The semiconductor layer 122, the gate electrode 132, and the source and drain electrodes 142 and 144 form a thin film transistor T. The thin film transistor T has a coplanar structure in which the gate electrode 132 and the source and drain electrodes 142 and 144 are located at the same side with respect to the semiconductor layer 122.

Alternatively, the thin film transistor T can have an inverted staggered structure in which the gate electrode and the source and drain electrodes are located at different sides with respect to the semiconductor layer. For example, the gate electrode can be disposed under the semiconductor layer, and the source and drain electrodes can be disposed over the semiconductor layer. In this case, the semiconductor layer can be formed of oxide semiconductor or amorphous silicon.

The thin film transistor T can correspond to a driving thin film transistor T2 of FIG. 1, and a switching thin film transistor T1 of FIG. 1 having the same structure as the thin film transistor T can be further formed on the substrate 100.

A passivation layer 150 of an insulating material is formed on the source and drain electrodes 142 and 144 and the second auxiliary electrode 146 substantially over the entire surface of the substrate 100. The passivation layer 150 can be formed of an inorganic insulating material such as silicon oxide ($SiO_2$) or silicon nitride (SiNx).

Next, an overcoat layer 155 of an insulating material is formed on the passivation layer 150 substantially over the entire surface of the substrate 100. The overcoat layer 155 can be formed of an organic insulating material such as photo acryl or benzocyclobutene. The overcoat layer 155 can eliminate level differences due to under layers and have a substantially flat top surface.

Here, one of the passivation layer 150 and the overcoat layer 155 can be omitted. For example, the passivation layer 150 can be omitted, but is not limited thereto.

The passivation layer 150 and the overcoat layer 155 have a drain contact hole 155a exposing the drain electrode 144. Further, the passivation layer 150 and the overcoat layer 155 have a fifth contact hole 155b exposing the second auxiliary electrode 146.

A first electrode 160, which has relatively high work function, is formed on the overcoat layer 155 in the emission area EA and formed of a conductive material. The first electrode 160 is in contact with the drain electrode 144 through the drain contact hole 155a.

The first electrode 160 includes a first layer 160a, a second layer 160b, and a third layer 160c. Here, the second layer 160b is disposed between the first layer 160a and the third layer 160, and the first layer 160a is disposed between the second layer 160b and the substrate 100, more particularly, between the second layer 160b and the overcoat layer 155.

The first layer 160a is formed to improve the adhesion property between the second layer 160b and the overcoat layer 155. The first layer 160a can be formed of a transparent conductive material such as indium tin oxide (ITO) or indium zinc oxide (IZO), but is not limited thereto. The first layer 160a can be omitted.

The second layer 160b is formed of a metal material having relatively high reflectance. For example, the second layer 160b can be formed of silver (Ag), aluminum (Al) or molybdenum (Mo).

The third layer 160c is formed of a conductive material having relatively high work function. For example, the third layer 160c can be formed of a transparent conductive material such as ITO or IZO. Here, the work function of the third layer 160c is higher than the work function of the second layer 160b.

A thickness of the second layer 160b can be greater than a thickness of the third layer 160c. For example, the thickness of the second layer 160b can be 80 nm to 100 nm, and the thickness of the third layer 160c can be 10 nm to 80 nm. However, the present disclosure is not limited thereto. A thickness of the first layer 160a can be smaller than the thickness of the second layer 160b and can be smaller than or equal to the thickness of the third layer 160c. For example, the thickness of the first layer 160a can be 10 nm, but is not limited thereto.

Meanwhile, a connection pattern 162 is formed on the overcoat layer 155 between the emission area EA and the transparent area TA and is formed of the same material as the first electrode 160. Accordingly, the connection pattern 162 can include first, second, and third layers 162a, 162b, and 162c. At this time, the second layer 162b is disposed between the first layer 162a and the third layer 162c, and the first layer 162a is disposed between the second layer 162b and the substrate 100, more particularly, between the second layer 162b and the overcoat layer 155. The connection pattern 162 is in contact with the second auxiliary electrode 146 through the fifth contact hole 155b.

A bank 170 of an insulating material is formed on the first electrode 160 and the connection pattern 162. The bank 170 overlaps and covers edges of each of the first electrode 160 and the connection pattern 162.

The bank 170 has a first opening 170a, a second opening 170c, and an auxiliary contact hole 170b. The first opening 170a corresponds to the emission area EA, the second opening 170c corresponds to the transparent area TA, and the auxiliary contact hole 170b is disposed in the area between emission area EA and the transparent area TA.

The first opening 170a exposes a central portion of the first electrode 160, the second opening 170c exposes a top surface of the overcoat layer 155, and the auxiliary contact hole 170b exposes a part of the connection pattern 162.

The bank 170 includes a first bank 172 of a hydrophilic property and a second bank 174 of a hydrophobic property. The second bank 174 is disposed on the first bank 172. The second bank 174 has a narrower width than the first bank 172 and exposes edges of a top surface of the first bank 172. In addition, the second bank 174 can have a thicker thickness than the first bank 172.

The first bank 172 can be formed of a material having a hydrophilic property, for example, an inorganic insulating material such as silicon oxide ($SiO_2$) or silicon nitride (SiNx). Alternatively, the first bank 172 can be formed of polyimide.

In addition, at least a top surface of the second bank 174 is hydrophobic, and a side surface of the second bank 174 can be hydrophobic or hydrophilic. The second bank 174 can be formed of an organic insulating material having a hydrophobic property. Alternatively, the second bank 174 can be formed of an organic insulating material having a hydrophilic property and subjected to a hydrophobic treatment.

Meanwhile, the first bank 172 and the second bank 174 are formed of different materials and separated from each other. However, the hydrophilic first bank 172 and the hydrophobic second bank 174 can be formed of the same material and formed as one body. For example, an organic material layer can be formed substantially over the entire surface of the substrate 100, can be exposed to light through a halftone mask including a light-transmitting portion, a light-blocking portion and a half light-transmitting portion, and can be patterned, thereby forming the hydrophilic first bank 172 and the hydrophobic second bank 174.

Alternatively, the first bank 172 can be omitted.

A light-emitting layer 180 is formed on the first electrode 160 exposed through the first opening 170a. Side surfaces of the light-emitting layer 180 facing each other are enclosed by the second bank 174. The light-emitting layer 180 is disposed in the emission area EA.

The light-emitting layer 180 includes a light-emitting material layer. The light-emitting material layer can be formed of any one of red, green, and blue luminescent materials, but is not limited thereto. The luminescent material can be an organic luminescent material such as a phosphorescent compound or a fluorescent compound or can be an inorganic luminescent material such as a quantum dot.

Further, the light-emitting layer 180 can further include a first charge auxiliary layer under the light-emitting material layer and a second charge auxiliary layer on the light-emitting material layer.

The first charge auxiliary layer can be a hole auxiliary layer, and the hole auxiliary layer can include at least one of a hole injecting layer (HIL) and a hole transporting layer (HTL). In addition, the second charge auxiliary layer can be an electron auxiliary layer, and the electron auxiliary layer can include at least one of an electron injecting layer (EIL) and an electron transporting layer (ETL). However, the present disclosure is not limited thereto.

The light-emitting layer 180 can be formed through a solution process. Thus, the process can be simplified and a display device with a large size and high resolution can be provided. A spin coating method, an ink jet printing method, or a screen printing method can be used as the solution process, but the present disclosure is not limited thereto.

When the solution is dried, a drying speed of a solvent in a region adjacent to the second bank 174 is different from that in other regions. For example, the drying speed of the solvent in the region adjacent to the second bank 174 is faster than that in the other regions. Therefore, a height of the light-emitting layer 180 in the region adjacent to the second bank 174 can rise as it gets closer to the second bank 174. The height of the light-emitting layer 180 at an edge of the emission area EA is higher than the height of the light-emitting layer 180 at a center of the emission area EA.

Meanwhile, the electron auxiliary layer of the light-emitting layer 180 can be formed through a thermal evaporation process. Accordingly, the electron auxiliary layer can be formed substantially over the entire surface of the substrate 100.

A second electrode 190 of a conductive material having a relatively low work function is formed on the light-emitting layer 180, the second bank 174, and the connection patterns 162 substantially over the entire surface of the substrate 100, and more particularly, substantially all over a display area including the plurality of pixels P. At this time, the second electrode 190 is formed in the entire pixel P excluding the transparent area TA. Accordingly, the second electrode 190 is not formed in the transparent area TA, and the second electrode 190 is formed in the emission area EA and also formed between the emission area EA and the transparent area TA.

The second electrode 190 can be formed of aluminum (Al), magnesium (Mg), silver (Ag), or an alloy thereof. The second electrode 190 has a relatively thin thickness such that light from the light-emitting layer 180 can be transmitted therethrough. For example, the second electrode 190 can have the thickness of 5 nm to 10 nm.

The second electrode 190 is electrically connected to the connection pattern 162 through the auxiliary contact hole 170b.

The first electrode 160, the light-emitting layer 180, and the second electrode 190 constitute a light-emitting diode De. The first electrode 160 can serve as an anode, and the second electrode 190 can serve as a cathode, but is not limited thereto.

Meanwhile, an anti-deposition layer 195 is formed on the overcoat layer 155 exposed in the transparent area TA.

The anti-deposition layer 195 is formed through a solution process using an organic material. Accordingly, a height of the anti-deposition layer 195 in the region adjacent to the second bank 174 rise as it gets closer to the second bank 174, and the height of the anti-deposition layer 195 at an edge of the transparent area TA is higher than the height of the anti-deposition layer 195 at a center of the transparent area TA.

The anti-deposition layer 195 can be formed of a material represented by Formula 1, for example, 3-(4-biphenyl)-4-phenyl-5-tert-butylphenyl-1,2,4-triazole (TAZ).

Formula 1

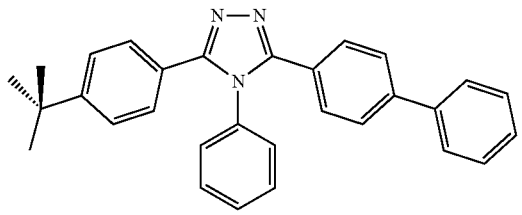

Alternatively, the anti-deposition layer 195 can be formed of a phase-transition optical isomer compound having a rubbery phase. The phase-transition optical isomer compound undergoes a phase transition between a rubbery phase and a glassy phase according to light irradiation.

The phase-transition optical isomer compound of the present disclosure can include a material represented by Formula 2.

Formula 2

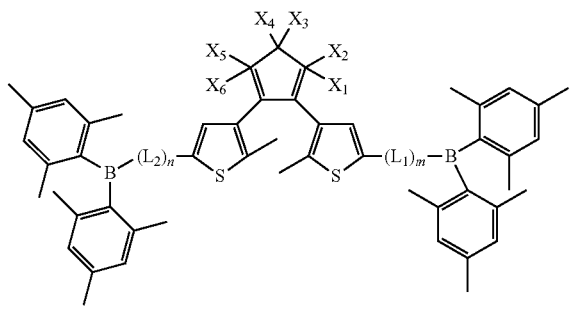

In Formula 2, each of $L_1$ and $L_2$ can be aryl or heteroaryl, and each of m and n can be 0 or 1. In addition, each of $X_1$ to $X_6$ can be independently selected from a hydrogen or halogen atom. For example, $L_1$ and $L_2$ can be phenyl, and all of $X_1$ to $X_6$ can be hydrogen (H) or fluorine (F).

Alternatively, the phase-transition optical isomer compound of the present disclosure can include a material represented by Formula 3.

Formula 3

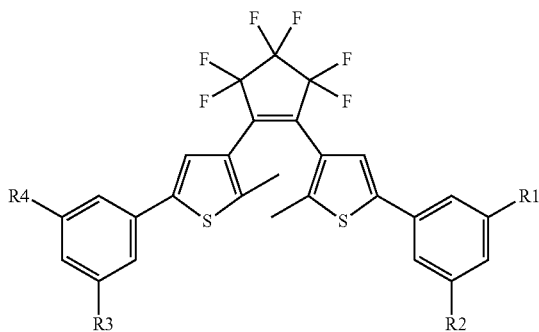

In Formula 3, each of R1 to R4 is independently selected from a heteroaromatic group containing a nitrogen atom. For example, each of R1 to R4 can be independently selected from pyridyl (pyridinyl) or quinolinyl. R1 to R4 can be the same or different from one another.

The anti-deposition layer 195 exhibits a relatively low probability of initial fixation, thereby preventing the second electrode 190 from being formed in the transparent area TA. At this time, the anti-deposition layer 195 is transparent, and the transmittance of the anti-deposition layer 195 is higher than the transmittance of the second electrode 190. The thickness of the second electrode 190 adjacent to the transparent area TA is thicker than the thickness of the second electrode 190 on the light-emitting layer 180 due to the anti-deposition layer 195. This will be described in detail later.

Meanwhile, when the anti-deposition layer 195 is formed of the material represented by Formula 1, it is beneficial that the second electrode 190 is formed of magnesium (Mg).

As described above, the transparent display device 1000 according to the first embodiment of the present disclosure can be a top emission type in which light from the light-emitting layer 180 of the light-emitting diode De is output toward a direction opposite the substrate 100, for example, output to the outside through the second electrode 190. The top emission type display device can have a wider emission area than a bottom emission type display device of the same size, to thereby improve luminance and reduce power consumption.

At this time, the light-emitting diode De of each sub-pixel can have an element thickness for a micro-cavity effect corresponding to a wavelength of the emitted light, thereby increasing the light efficiency.

In the meantime, a protective layer and/or an encapsulating layer can be formed on the second electrode 190 substantially over the entire surface of the substrate 100 to block moisture or oxygen introduced from the outside, thereby protecting the light-emitting diode De.

In addition, a capping layer can be formed on the second electrode 190 substantially over the entire surface of the substrate 100. The capping layer can be formed of an insulating material having a relatively high refractive index. The wavelength of light traveling along the capping layer can be amplified by surface plasma resonance, and thus the intensity of the peak can be increased, thereby improving the light efficiency in the top emission type electroluminescent display device. For example, the capping layer can be formed as a single layer of an organic layer or an inorganic layer or formed as organic/inorganic stacked layers.

As described above, in the transparent display device 1000 according to the first embodiment of the present disclosure, the pixel P includes the emission area EA and the transparent area TA, so that the surrounding environment information such as backgrounds can be shown together through the transparent area TA while displaying the image information through the emission area EA.

In addition, in the transparent display device 1000 according to the first embodiment of the present disclosure, by forming some of the light-emitting layer 180 through the solution process, a fine metal mask can be omitted to thereby reduce the manufacturing costs, and a display device with a large size and high definition can be implemented.

Further, the transparent display device 1000 according to the first embodiment of the present disclosure is implemented as the top emission type, thereby improving the luminance and reducing the power consumption. Here, since the second electrode 190 is formed to have the relatively thin thickness in order to transmit light, the resistance of the second electrode 190 can be increased, but the resistance of the second electrode 190 can be lowered by connecting the second electrode 190 to the first and second auxiliary electrodes 114 and 146 through the connection pattern 162.

Moreover, in the transparent display device 1000 according to the first embodiment of the present disclosure, the anti-deposition layer 195 is formed in the transparent area TA, thereby preventing the second electrode 190 from being deposited in the transparent area TA. Accordingly, the transmittance of the transparent area TA increases, so that clearer surrounding environment information can be provided.

Otherwise, if necessary, the image information of higher quality can be provided by decreasing the size of the transparent area TA to make the transmittance of the transparent part TA the same as before and increasing the size of the emission area EA.

A manufacturing method of the transparent display device 1000 according to the first embodiment of the present disclosure will be described in detail with reference to FIGS. 4A to 4E.

FIGS. 4A to 4E are cross-sectional views schematically illustrating a manufacturing process of the according to the first embodiment of the present disclosure and correspond to the line I-I' of FIG. 2.

Figure 4A:
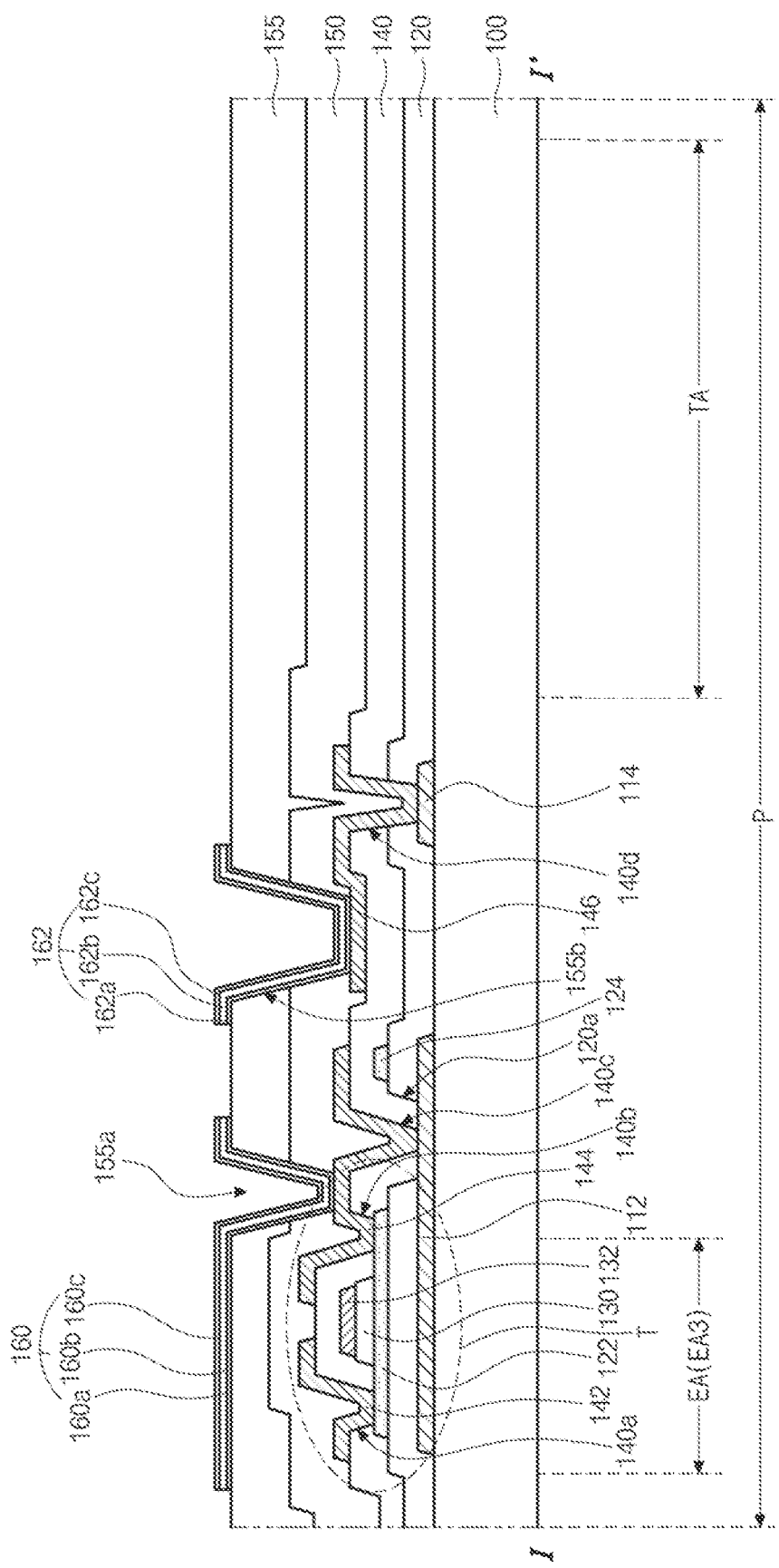
FIGS. 4A to 4E are cross-sectional views schematically illustrating a manufacturing process of the transparent display device of FIG. 3 according to the first embodiment of the present disclosure.

In FIG. 4A, a light-blocking pattern 112 and a first auxiliary electrode 114 are formed on an insulating substrate 100 on which a pixel P including an emission area EA and a transparent area TA is defined by depositing a first conductive material and patterning it through a first mask process.

Next, a buffer layer 120 is formed on the light-blocking pattern 112 and the first auxiliary electrode 114 by depositing an inorganic insulating material substantially over an entire surface of the substrate 100 and is patterned through a second mask process, thereby forming a buffer hole 120a partially exposing a top surface of the light-blocking pattern 112.

Then, a semiconductor layer 122 and a capacitor electrode 124 are formed on the buffer layer 120 by depositing a semiconductor material and patterning it through a third mask process. The semiconductor layer 122 and the capacitor electrode 124 are spaced apart from each other over the light-blocking pattern 112.

The semiconductor material can be polycrystalline silicon, and in this case, both ends of the semiconductor layer 122 and the capacitor electrode 124 can be doped with impurities later. Alternatively, the semiconductor material can be an oxide semiconductor material.

A gate insulation layer 130 and a gate electrode 132 are formed by sequentially depositing an inorganic insulating material and a second conductive material on the semiconductor layer 122 and the capacitor electrode 124 and patterning them through a fourth mask process. The gate insulation layer 130 and the gate electrode 132 are disposed to correspond to a center of the semiconductor layer 122.

Then, an interlayer insulation layer 140 is formed on the gate electrode 132 and the capacitor electrode 124 by depositing an inorganic insulating material or applying an organic insulating material substantially over the entire surface of the substrate 100 and is patterned through a fifth mask process, thereby forming first, second, third, and fourth contact holes 140a, 140b, 140c, and 140d. At this time, the buffer layer 120 can also be selectively removed.

The first and second contact holes 140a and 140b expose the both ends of the semiconductor layer 122. The third contact hole 140c partially exposes the top surface of the light-blocking pattern 112 corresponding to the buffer hole 120a. Here, the buffer hole 120a can be omitted, and the third contact hole 140c can be formed in the buffer layer 120 as well as in the interlayer insulation layer 140 to partially expose the top surface of the light-blocking pattern 112. In this case, the second mask process is omitted. In addition, the fourth contact hole 140d is formed in the buffer layer 120 as well as in the interlayer insulation layer 140 to partially expose a top surface of the first auxiliary electrode 114.

Next, source and drain electrodes 142 and 144 and a second auxiliary electrode 146 are formed on the interlayer insulation layer 140 by depositing a third conductive material and patterning it through a sixth mask process.

The source and drain electrodes 142 and 144 are in contact with the both ends of the semiconductor layer 122 through the first and second contact holes 140a and 140b, respectively. Further, the drain electrode 144 contacts the light-blocking pattern 112 through the third contact hole 140c and overlaps the capacitor electrode 124.

Meanwhile, the second auxiliary electrode 146 contacts the first auxiliary electrode 114 through the fourth contact hole 140d.

Next, a passivation layer 150 is formed on the source and drain electrodes 142 and 144 and the second auxiliary electrode 146 by depositing an inorganic insulating material, and an overcoat layer 155 is formed on the passivation layer 150 by applying an organic insulating material. Then, the passivation layer 150 and the overcoat layer 155 are patterned through a seventh mask process, thereby forming a drain contact hole 155a and a fifth contact hole 155b.

The drain contact hole 155a partially exposes the drain electrode 144, and the fifth contact hole 155b partially exposes the second auxiliary electrode 146.

Here, it is described that the passivation layer 150 and the overcoat layer 155 are patterned through the same mask process, but the passivation layer 150 and the overcoat layer 155 can be patterned through different mask processes. For example, after the passivation layer 150 is formed by depositing an inorganic insulating material and patterned through a mask process, the overcoat layer 155 can be formed by applying an organic insulating material and can be patterned through another mask process.

Next, a first electrode 160 and a connection pattern 162 are formed on the overcoat layer 155 by sequentially depositing first, second, and third conductive layers and patterning them through an eighth mask process.

Here, the first and third conductive layers can be formed of ITO or IZO, and the second conductive layer can be formed of silver (Ag), aluminum (Al) or molybdenum (Mo).

The first electrode 160 and the connection pattern 162 each include a first layer 160a and 162a, a second layer 160b and 162b, and a third layer 160c and 162c. The second layer 160b and 162b is disposed between the first layer 160a and 162a and the third layer 160c and 162c, and the first layer 160a and 162a is disposed between the second layer 160b and 162b and the overcoat layer 155.

The first electrode 160 is disposed in the emission area EA and is in contact with the drain electrode 144 through the drain contact hole 155a. In addition, the connection pattern 162 is disposed between the emission area EA and the transparent area TA and is in contact with the second auxiliary electrode 146 through the fifth contact hole 155b.

Figure 4B:
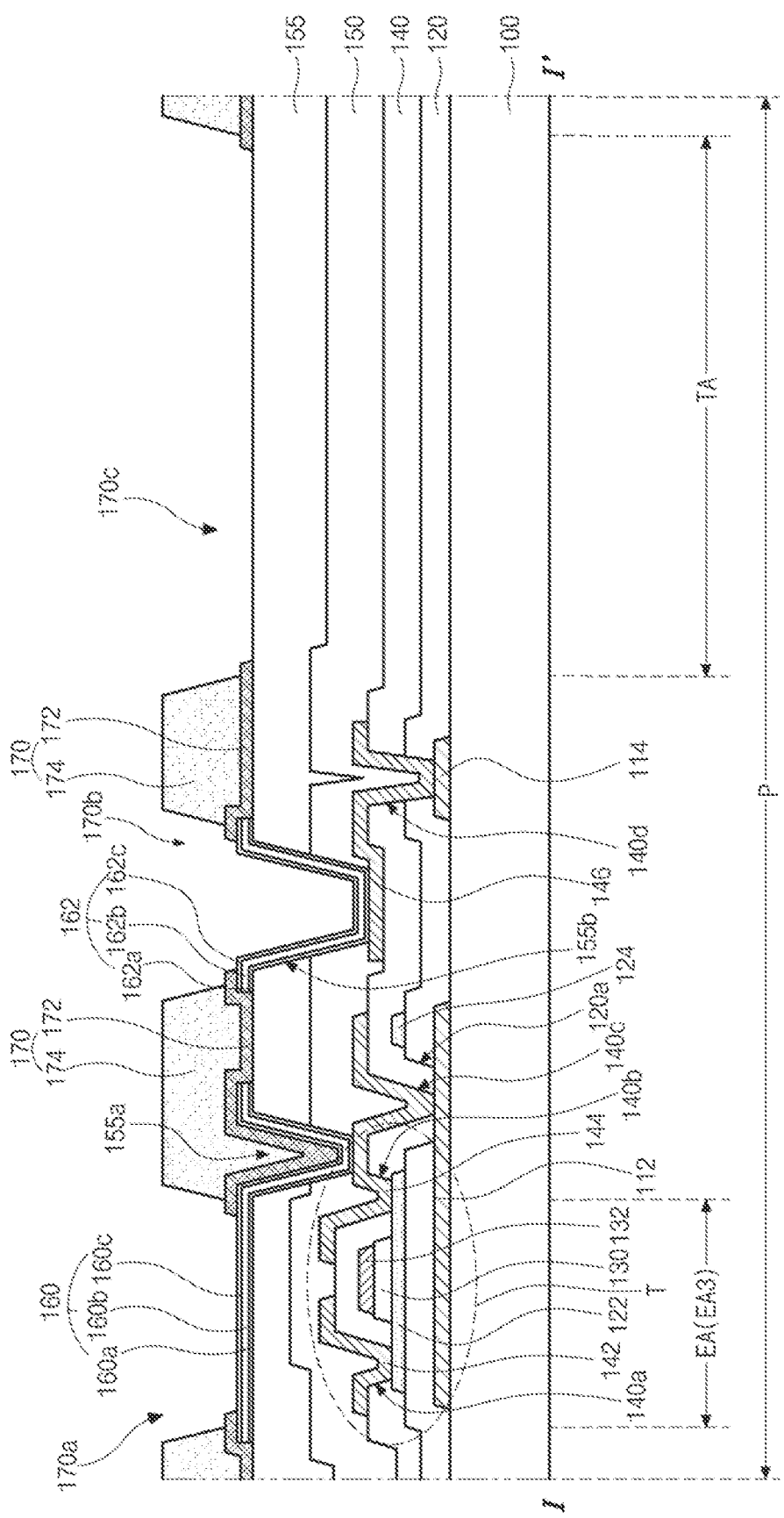

Next, in FIG. 4B, a bank 170 including a first bank 172 of a hydrophilic property and a second bank 174 of a hydrophobic property is formed on the first electrode 160 and the connection pattern 162 by depositing or applying an insulating material and patterning it through a mask process. At this time, an insulating material having a hydrophilic property is deposited and patterned through a ninth mask process to thereby form the first bank 172, and an organic insulating material having a hydrophobic property is applied and patterned through a tenth mask process or an organic insulating material having a hydrophilic property is applied, patterned through a ninth mask process, and subjected to a hydrophobic treatment to thereby form the second bank 174.

Alternatively, the first bank 172 and the second bank 174 can be formed through one mask process. For example, an organic insulating material is formed substantially over the entire surface of the substrate 100, is exposed to light using a halftone mask including a light-transmitting portion, a light-blocking portion and a half light-transmitting portion, and is patterned, thereby forming the first bank 172 of a hydrophilic property and the second bank 174 of a hydrophobic property that are one body and have different widths and thicknesses.

The bank 170 has a first opening 170a corresponding to the emission area EA, a second opening 170c corresponding to the transparent area TA, and an auxiliary contact hole 170b disposed in the area between emission area EA and the transparent area TA.

The first opening 170a exposes a central portion of the first electrode 160, the second opening 170c exposes a top surface of the overcoat layer 155, and the auxiliary contact hole 170b exposes a part of the connection pattern 162.

Figure 4C:
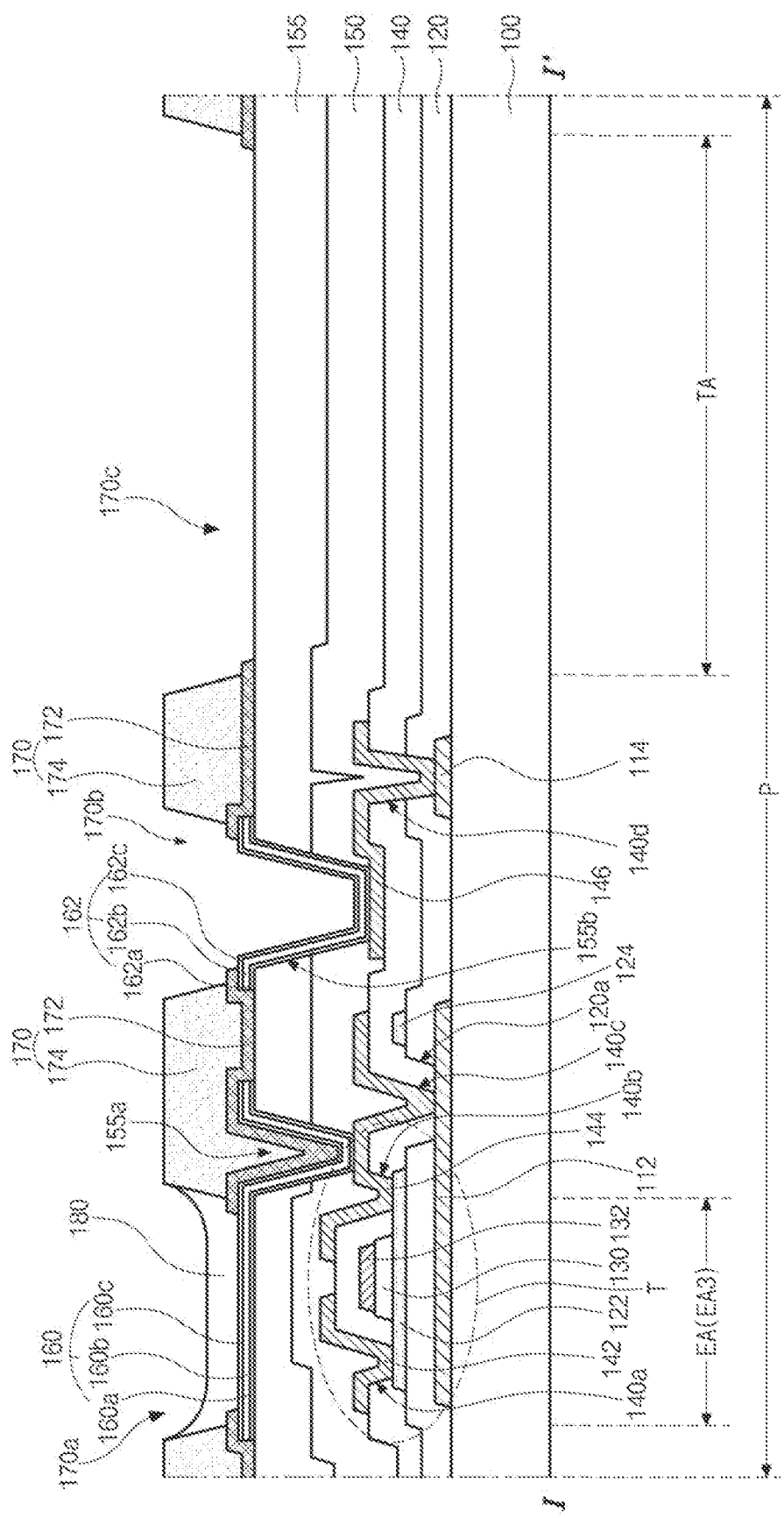

Next, in FIG. 4C, a light-emitting layer 180 is formed on the first electrode 160 exposed through the first opening 170a of the bank 170 by dropping a solution and drying it. At least one side surface of the light-emitting layer 180 is enclosed by the second bank 174. When the solution is dried, a drying speed of a solvent in a region adjacent to the second bank 174 is different from that in other regions, and thus a height of the light-emitting layer 180 in the region adjacent to the second bank 174 rises as it gets closer to the second bank 174.

Figure 4D:
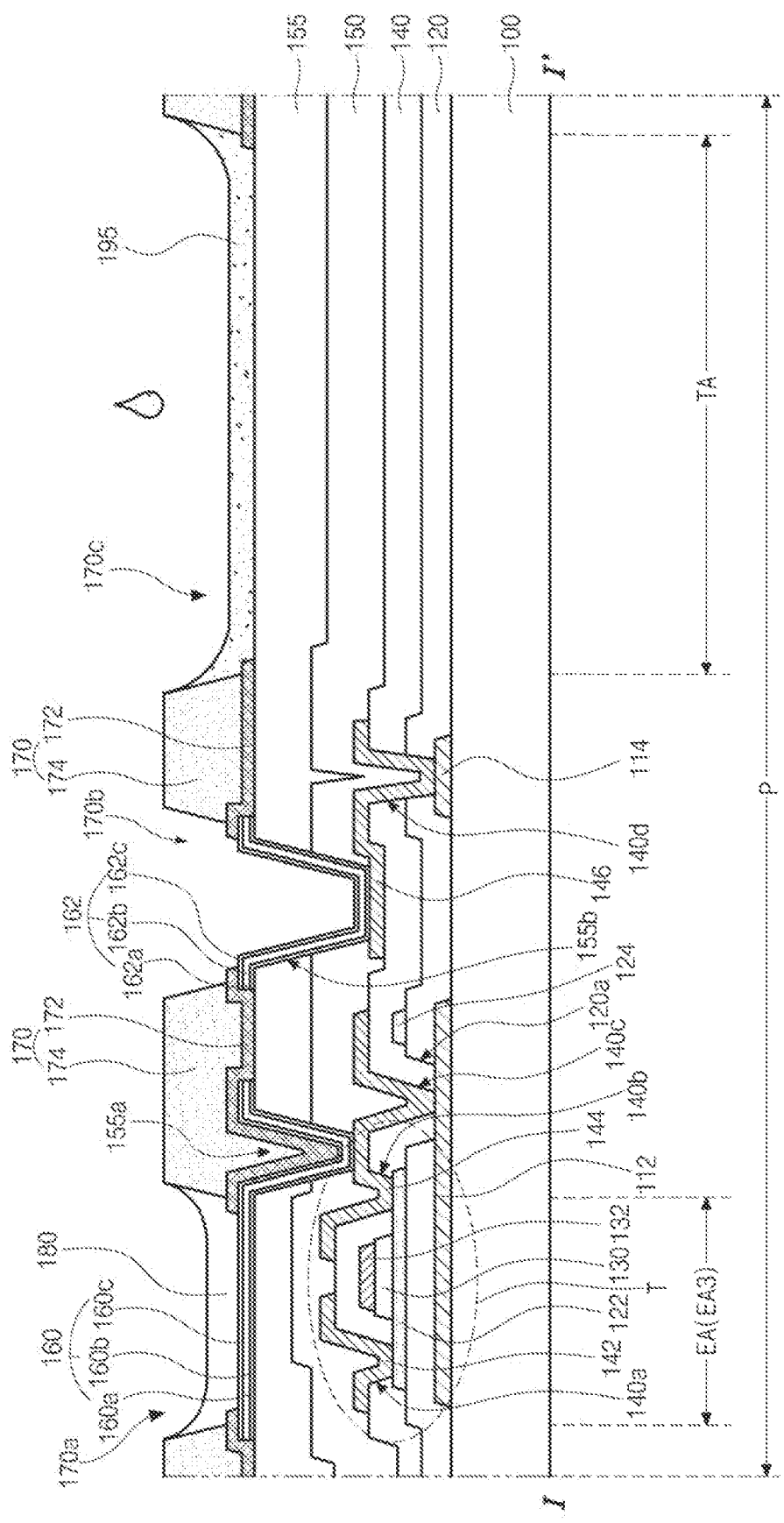
Figure 4E:
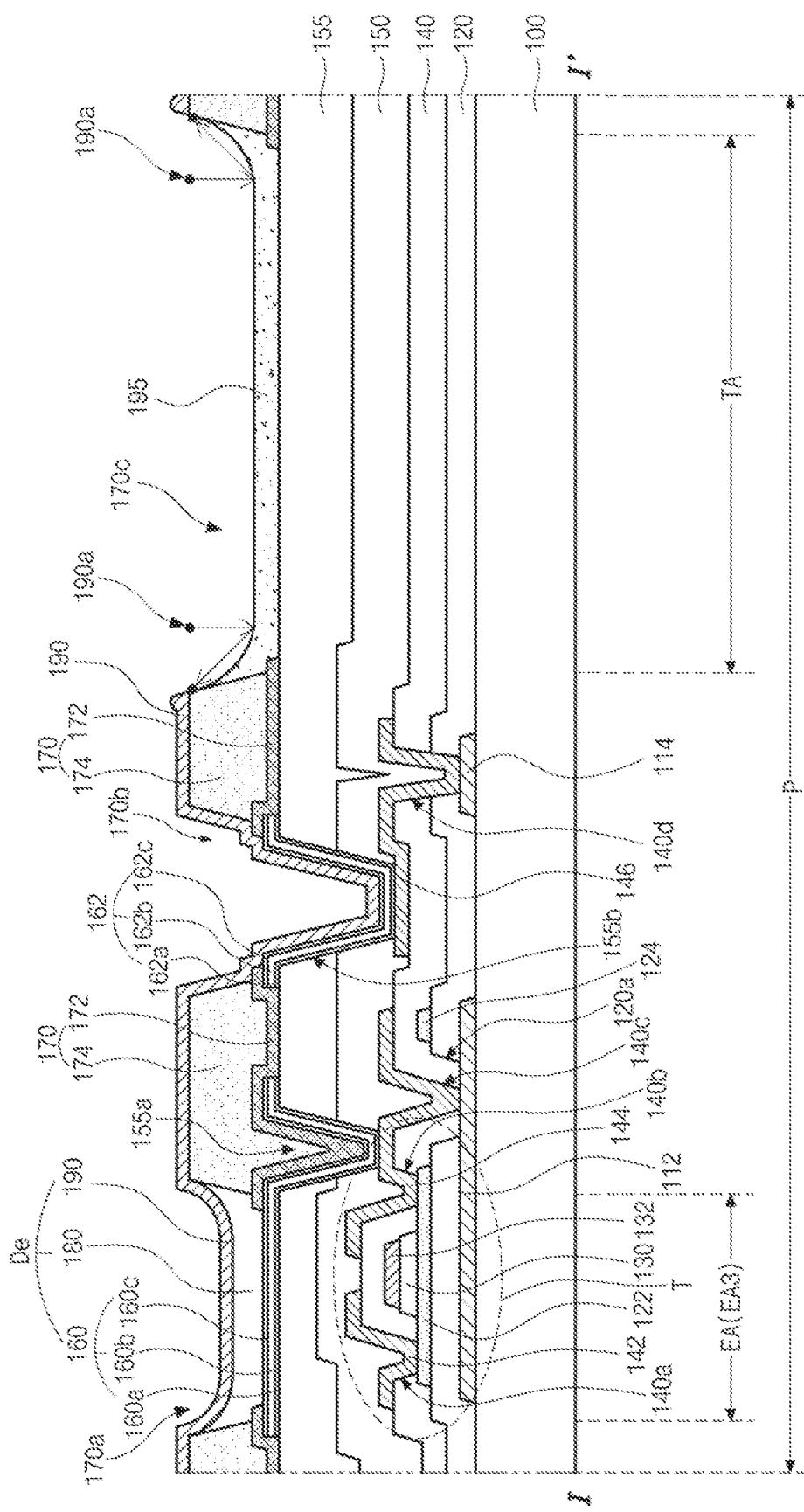

Next, in FIG. 4D, an anti-deposition layer 195 is formed on the overcoat layer 155 exposed through the second opening 170c of the bank 170 by dropping a solution and drying it. Side surfaces of the anti-deposition layer 195 are surrounded by the second bank 174. When the solution is dried, a drying speed of a solvent in a region adjacent to the second bank 174 is different from that in other regions, and thus a height of the anti-deposition layer 195 in the region adjacent to the second bank 174 rises as it gets closer to the second bank 174.

The anti-deposition layer 195 can be formed of one of the materials represented by Formulas 1 to 3. At this time, the solvent can be at least one, beneficially, two or three mixed solvents, selected from aromatic ester derivatives, aromatic ether derivatives, aromatic hydrocarbon derivatives, and aromatic ketone derivatives Next, in FIG. 4E, a second electrode 190 is formed on the light-emitting layer 180 by depositing a conductive material 190a such as metal. The second electrode 190 is formed substantially over the entire surface of the substrate 100 except form the transparent area TA. The second electrode 190 is electrically connected to the connection pattern 162 through the auxiliary contact holes 170b.

The surface of the anti-deposition layer 195 formed in the transparent area TA has a relatively low affinity with the conductive material 190a compared to surfaces of other layers, for example, the surfaces of the light-emitting layer 180 and the bank 170. For example, the surface of the anti-deposition layer 195 exhibits a relatively low probability of initial fixation compared to the surfaces of the light-emitting layer 180 and the bank 170. Accordingly, the conductive material 190a deposited onto the anti-deposition layer 195 in the transparent area TA is not fixed to the surface of the anti-deposition layer 195 and moves toward the bank 170 having a relatively high affinity, thereby migrating outside the transparent area TA. Accordingly, the second electrode 190 is not formed in the transparent area TA, and the thickness of the edge of the second electrode 190 is thicker than other portions. Namely, the thickness of the second electrode 190 adjacent to the anti-deposition layer 195 of the transparent area TA is thicker than the thickness of the second electrode 190 on the light-emitting layer 180 of the emission area EA.

The first electrode 160, the light-emitting layer 180, and the second electrode 190 constitute a light-emitting diode De. The first electrode 160 can serve as an anode, and the second electrode 190 can serve as a cathode.

As described above, in the transparent display device 1000 according to the first embodiment of the present disclosure, the second electrode 190 is electrically connected to the first and second auxiliary electrodes 114 and 146 through the connection pattern 162, which is formed of the same material and through the same process as the first electrode 160. Accordingly, the resistance of the second electrode 190 can be lowered.

In addition, the anti-deposition layer 195 is formed in the transparent area TA, thereby preventing the second electrode 190 from being formed in the transparent area TA. Therefore, the transmittance of the transparent area TA can be improved. The anti-deposition layer 195 is formed through the solution process, so that the second electrode 190 can be patterned without a photolithographic process using a photomask, and it is possible to simplify the manufacturing processes of the display device.

Figure 5:
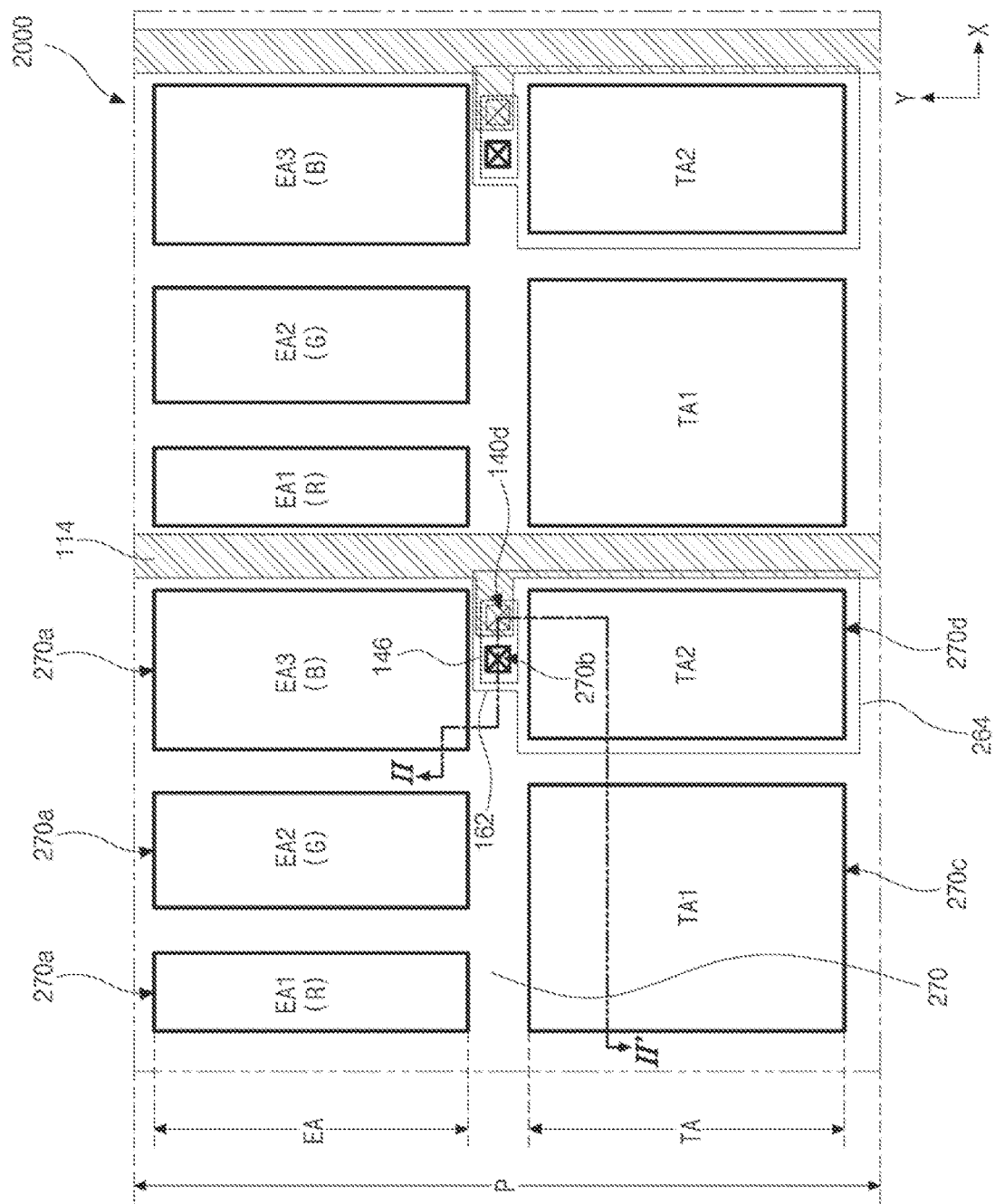
FIG. 5 is a schematic plan view of a transparent display device according to a second embodiment of the present disclosure.

FIG. 5 is a schematic plan view of a transparent display device according to a second embodiment of the present disclosure and mainly shows a bank configuration. The transparent display device of the second embodiment has substantially the same configuration as that of the first embodiment except for a transparent area and an auxiliary connection pattern. The same parts as those of the first embodiment are designated by the same reference signs, and explanation for the same parts will be shortened or omitted.

As shown in FIG. 5, in a transparent display device 2000 according to the second embodiment of the present disclosure, each pixel P includes an emission area EA and a transparent area TA. In an example, each pixel P can include three emission areas EA and two transparent areas TA, and each of the emission areas EA has substantially the same configuration except for the sizes.

More particularly, the pixel P includes first, second, and third sub-pixels, for example, red, green, and blue sub-pixels. The emission area EA can include first, second, and third emission areas EA1, EA2, and EA3 corresponding to the red, green, and blue sub-pixels, respectively. In addition, the transparent area TA includes first and second transparent areas TA1 and TA2, and the first and second transparent areas TA1 and TA2 have different transmittances. Here, the transmittance of the first transparent area TA1 is higher than the transmittance of the transparent area TA2 based on the same area.

The emission area EA and the transparent area TA are arranged along a Y direction. The first, second, and third emission areas EA1, EA2, and EA3 are arranged along an X direction, and the first and second transparent areas TA1 and TA2 are arranged along the X direction.

The first, second, and third emission areas EA1, EA2, and EA3 can have different sizes. For example, the size of the second emission area EA2 of the green sub-pixel can be larger than the size of the first emission area EA1 of the red sub-pixel and smaller than the size of the third emission area EA3 of the blue sub-pixel, but is not limited thereto.

The first and second transparent areas TA1 and TA2 can have different sizes. At this time, the size of the first transparent area TA1 can be larger than the size of the second transparent area TA2. Alternatively, the first and second transparent areas TA1 and TA2 can have the same size. In addition, the minimum size of the second transparent area TA2 can be the same as the size of the first emission area EA1. Accordingly, the size of the second transparent area TA2 can be equal to or larger than the size of the first emission area EA1 and smaller than the size of the first transparent area TA1.

A bank 270 is formed between adjacent ones of the first, second, and third emission areas EA1, EA2, and EA3 and the first and second transparent areas TA1 and TA2. The bank 270 has a first opening 270a corresponding to each of the first, second, and third emission areas EA1, EA2, and EA3. The bank 270 also has second and third openings 270c and 270d corresponding to the first and second transparent areas TA1 and TA2, respectively. In addition, the bank 270 has an auxiliary contact hole 270b between the emission area EA and the transparent area TA.

Each of the first, second, and third openings 270a, 270c, and 270d is illustrated as having a rectangular shape, but is not limited thereto. Each of the first, second, and third openings 270a, 270c, and 270d can have various shapes such as a rectangular shape with rounded corners, an oval shape, or the like.

Meanwhile, first and second auxiliary electrodes 114 and 146, a connection pattern 162, and an auxiliary connection pattern 264 are formed under the bank 270. The connection pattern 162 and the auxiliary connection pattern 264 can be referred to as a first connection pattern and a second connection pattern, respectively.

The second auxiliary electrode 146 is disposed between the emission area EA and the transparent area TA and is connected to the first auxiliary electrode 114 through a contact hole 140d.

In addition, the connection pattern 162 is disposed between the emission area EA and the transparent area TA and is connected to the second auxiliary electrode 146 through a contact hole under the auxiliary contact hole 270b.

The auxiliary connection pattern 264 is disposed to correspond to the second transparent area TA2 and is exposed through the third opening 270d. The auxiliary connection pattern 264 is in direct contact with the connection pattern 162. The auxiliary connection pattern 264 can overlap and cover the connection pattern 162. Alternatively, the auxiliary connection pattern 264 can extend from the connection pattern 162.

Meanwhile, a first electrode is formed of the same material as the connection pattern 162 in each of the first, second, and third emission areas EA1, EA2, and EA3, and the first electrode is exposed through the first opening 270a. A light-emitting layer is formed on the exposed first electrode, and a second electrode is formed on the light-emitting layer.

At this time, the second electrode is formed substantially over an entire surface of a substrate excluding the first transparent area TA1 and is electrically connected to the connection pattern 162 thereunder through the auxiliary contact hole 270b. The second electrode is also electrically connected to the first and second auxiliary electrodes 114 and 146 through the connection pattern 162, and thus the resistance of the second electrode, for example, the resistance of the cathode can be decreased.

Further, the second electrode is also disposed in the second transparent area TA2 and is electrically connected to the auxiliary connection pattern 264 through the third opening 270d.

There is a contact resistance between the second electrode and the connection pattern 162. As the contact resistance increases, the emission efficiency decreases. The contact resistance can be reduced by increasing the size of the auxiliary contact hole 270b. However, if the size of the auxiliary contact hole 270b increases, the sizes of the emission area EA and/or the transparent area TA decrease, and thus the aperture ratio of the pixel P decreases.

Accordingly, in the transparent display device 2000 according to the second embodiment of the present disclosure, while maximizing the aperture ratio of the pixel P by minimizing the size of the auxiliary contact hole 270b, the second electrode is electrically connected to the auxiliary connection pattern 264 as well as the connection pattern 162, so that the contact resistance of the second electrode can be decreased.

Meanwhile, an anti-deposition layer is formed in the first transparent area TA1, thereby preventing the second electrode from being deposited. Accordingly, the second electrode is not disposed in the first transparent area TA1, so that the transmittance of the transparent area TA can be increased by increasing the first transparent area TA1.

A cross-sectional structure of the transparent display device 2000 according to the second embodiment of the present disclosure will be described in detail with reference to FIG. 6.

Figure 6:
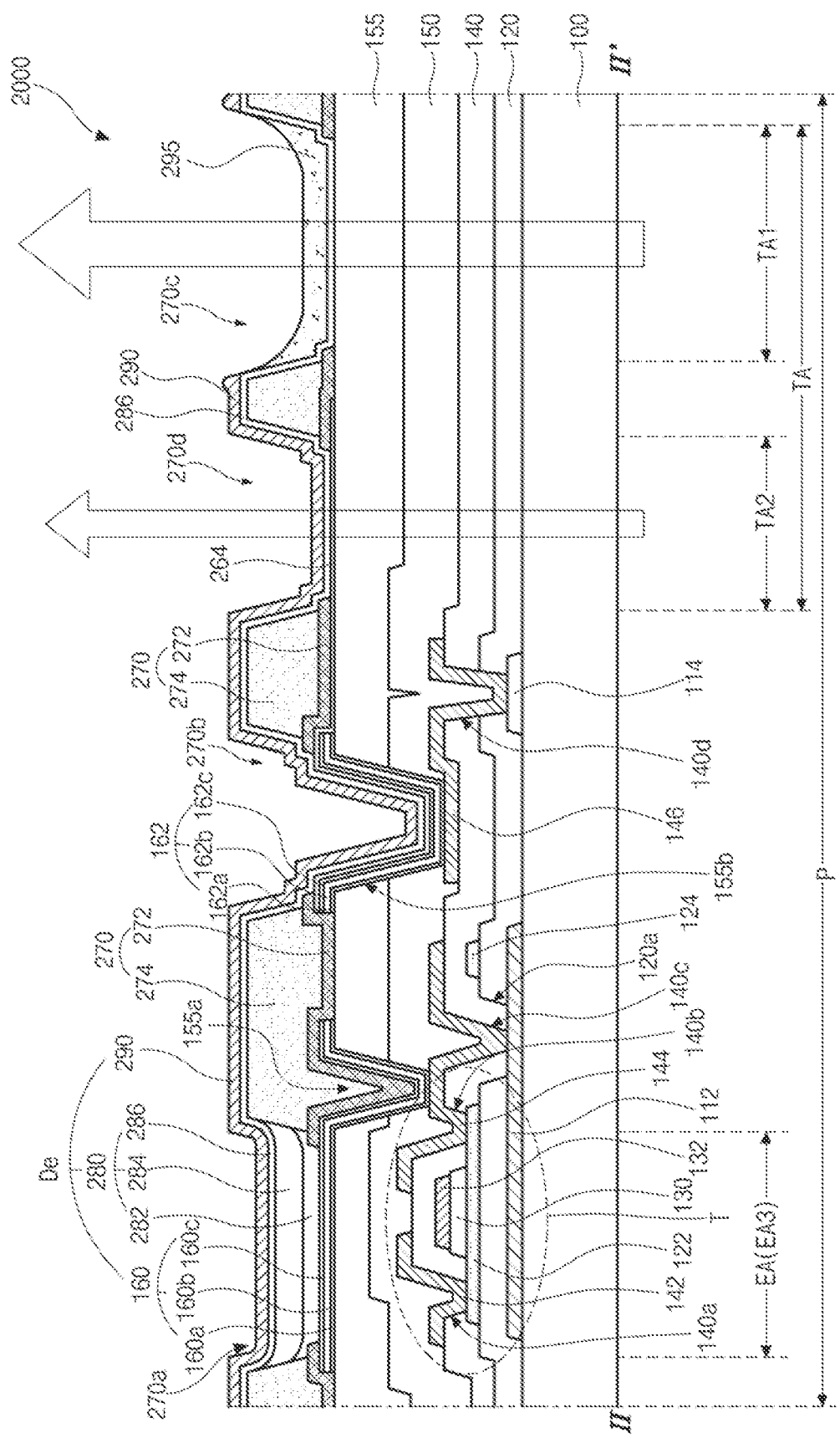
FIG. 6 is a schematic cross-sectional view of the transparent display device according to the second embodiment of the present disclosure and corresponds to the line II-II' of FIG. 5.

FIG. 6 is a schematic cross-sectional view of the transparent display device according to the second embodiment of the present disclosure and corresponds to the line II-II' of FIG. 5.

As shown in FIG. 6, in the transparent display device 2000 according to the second embodiment of the present disclosure, a pixel P including an emission area EA and a transparent area TA is defined on a substrate 100. A light-blocking pattern 112 and a first auxiliary electrode 114 are formed on the substrate 100. The transparent area TA includes a first transparent area TA1 and a second transparent area TA2.

Here, at least a part of the light-blocking pattern 112 can be disposed in the emission area EA, and at least a part of the first auxiliary electrode 114 can be disposed between the emission area EA and the transparent area TA.

A buffer layer 120 is formed on the light-blocking pattern 112 and the first auxiliary electrode 114 substantially on an entire surface of the substrate 100. The buffer layer 120 has a buffer hole 120a partially exposing a top surface of the light-blocking pattern 112.

A semiconductor layer 122 and a capacitor electrode 124 are patterned and formed on the buffer layer 120. The semiconductor layer 122 and the capacitor electrode 124 are spaced apart from each other over the light-blocking pattern 112.

A gate insulation layer 130 and a gate electrode 132 are sequentially formed on the semiconductor layer 122. As shown in the figure, the gate insulation layer 130 can be patterned to have substantially the same shape as the gate electrode 132. Alternatively, the gate insulation layer 130 may not be patterned and can be formed substantially over the entire surface of the substrate 100.

An interlayer insulation layer 140 is formed on the gate electrode 132 substantially over the entire surface of the substrate 100. The interlayer insulation layer 140 has first, second, third, and fourth contact holes 140a, 140b, 140c, and

140*d*. The first and second contact holes 140*a* and 140*b* expose the both ends of the semiconductor layer 122, respectively. The third contact hole 140*c* partially exposes the top surface of the light-blocking pattern 112 and is located in the buffer hole 120*a*. The fourth contact hole 140*d* is formed in the buffer layer 120 as well as in the interlayer insulation layer 140 to partially expose a top surface of the first auxiliary electrode 114.

Source and drain electrodes 142 and 144 and a second auxiliary electrode 146 are formed on the interlayer insulation layer 140.

The source and drain electrodes 142 and 144 contact the both ends of the semiconductor layer 122 through the first and second contact holes 140*a* and 140*b*, respectively. Further, the drain electrode 144 contacts the light-blocking pattern 112 through the third contact hole 140*c* and overlaps the capacitor electrode 124. The capacitor electrode 124 overlaps the light-blocking pattern 112 and the drain electrode 144 to form a storage capacitor.

Meanwhile, the second auxiliary electrode 146 contacts the first auxiliary electrode 114 through the fourth contact hole 140*d*.

In addition, a data line and a high voltage supply line can be further formed on the interlayer insulation layer 140.

The semiconductor layer 122, the gate electrode 132, and the source and drain electrodes 142 and 144 form a thin film transistor T.

A passivation layer 150 and an overcoat layer 155 are sequentially formed on the source and drain electrodes 142 and 144 and the second auxiliary electrode 146 substantially over the entire surface of the substrate 100. The overcoat layer 155 eliminates level differences due to under layers and has a substantially flat top surface.

The passivation layer 150 and the overcoat layer 155 have a drain contact hole 155*a* exposing the drain electrode 144. Further, the passivation layer 150 and the overcoat layer 155 have a fifth contact hole 155*b* exposing the second auxiliary electrode 146.

A first electrode 160 having relatively high work function is formed on the overcoat layer 155 in the emission area EA. The first electrode 160 is in contact with the drain electrode 144 through the drain contact hole 155*a*. The first electrode 160 includes a first layer 160*a*, a second layer 160*b*, and a third layer 160*c*.

Meanwhile, a connection pattern 162 is formed on the overcoat layer 155 between the emission area EA and the transparent area TA and is formed of the same material as the first electrode 160. Accordingly, the connection pattern 162 can include first, second, and third layers 162*a*, 162*b*, and 162*c*. The connection pattern 162 is in contact with the second auxiliary electrode 146 through the fifth contact hole 155*b*.

In addition, an auxiliary connection pattern 264 is formed on the overcoat layer 155 in the second transparent area TA2. The auxiliary connection pattern 264 extends into an area between the emission area EA and the transparent area TA and overlaps and covers the connection pattern 162. At this time, the auxiliary connection pattern 264 can overlap at least a part of the connection pattern 162 and can cover at least the part of the connection pattern 162.

The auxiliary connection pattern 264 is in contact with top and side surfaces of the connection pattern 162. More particularly, the auxiliary connection pattern 264 is in contact with the top surface of the third layer 162*c* of the connection pattern 162 and the side surfaces of the first, second, and third layers 162*a*, 162*b*, and 162*c*.

The auxiliary connection pattern 264, beneficially, is formed of a transparent conductive material such as ITO or IZO.

A bank 270 is formed on the first electrode 160, the connection pattern 162, and the auxiliary connection pattern 264. The bank 270 overlaps and covers edges of each of the first electrode 160, the connection pattern 162, and the auxiliary connection pattern 264.

The bank 270 has a first opening 270*a*, a second opening 270*c*, a third opening 270*d*, and an auxiliary contact hole 270*b*. The first opening 270*a* corresponds to the emission area EA, the second opening 270*c* corresponds to the first transparent area TA1, the third opening 270*d* corresponds to the second transparent area TA2, and the auxiliary contact hole 270*b* is disposed in the area between emission area EA and the transparent area TA.

The first opening 270*a* exposes a central portion of the first electrode 160, the second opening 270*c* exposes a top surface of the overcoat layer 155, the third opening 270*d* exposes a central portion of the auxiliary connection pattern 264, and the auxiliary contact hole 270*b* exposes a part of the connection pattern 162.

The bank 270 includes a first bank 272 of a hydrophilic property and a second bank 274 of a hydrophobic property. The second bank 274 is disposed on the first bank 272. The second bank 274 has a narrower width than the first bank 272 and exposes edges of a top surface of the first bank 272. In addition, the second bank 274 can have a thicker thickness than the first bank 272.

The first bank 272 can be formed of a material having a hydrophilic property, for example, an inorganic insulating material such as silicon oxide ($SiO_2$) or silicon nitride (SiNx). Alternatively, the first bank 272 can be formed of polyimide.

In addition, at least a top surface of the second bank 274 is hydrophobic, and a side surface of the second bank 274 can be hydrophobic or hydrophilic. The second bank 274 can be formed of an organic insulating material having a hydrophobic property. Alternatively, the second bank 274 can be formed of an organic insulating material having a hydrophilic property and subjected to a hydrophobic treatment.

Meanwhile, the first bank 272 and the second bank 274 are formed of different materials and separated from each other. However, the hydrophilic first bank 272 and the hydrophobic second bank 274 can be formed of the same material and formed as one body.

Alternatively, the first bank 272 can be omitted.

A light-emitting layer 280 is formed on the first electrode 160 exposed through the first opening 270*a*. The light-emitting layer 280 can include a first charge auxiliary layer 282, a light-emitting material layer 284, and a second charge auxiliary layer 286 sequentially disposed on the first electrode 160.

The light-emitting material layer 284 can be formed of any one of red, green, and blue luminescent materials corresponding to the red, green, and blue sub-pixels, respectively, but is not limited thereto. The luminescent material can be an organic luminescent material such as a phosphorescent compound or a fluorescent compound or can be an inorganic luminescent material such as a quantum dot.

The first charge auxiliary layer 282 can be a hole auxiliary layer, and the hole auxiliary layer can include at least one of a hole injecting layer (HIL) and a hole transporting layer (HTL). In addition, the second charge auxiliary layer 286 can be an electron auxiliary layer, and the electron auxiliary layer can include at least one of an electron injecting layer (EIL) and an electron transporting layer (ETL). However, the present disclosure is not limited thereto.

Here, each of the first charge auxiliary layer 282 and the light-emitting material layer 284 is formed through a solution process. Thus, the process can be simplified and a display device with a large size and high resolution can be provided. A spin coating method, an ink jet printing method, or a screen printing method can be used as the solution process, but the present disclosure is not limited thereto. When the solution is dried, a drying speed of a solvent in a region adjacent to the second bank 274 is different from that in other regions. For example, the drying speed of the solvent in the region adjacent to the second bank 274 is faster than that in the other regions. Therefore, heights of the first charge auxiliary layer 282 and the light-emitting material layer 284 in the region adjacent to the second bank 274 can rise as it gets closer to the second bank 274.

On the other hand, the second charge auxiliary layer 286 is formed through a thermal evaporation process. Accordingly, the second charge auxiliary layer 286 can be formed substantially over the entire surface of the substrate 100. For example, the second charge auxiliary layer 286 can be formed on the top and side surfaces of the second bank 274 and can also be formed on the connection pattern 162 and the auxiliary connection pattern 264. The second charge auxiliary layer 286 is in contact with the top and side surfaces of the second bank 274 and is also in contact with the auxiliary connection pattern 264. Further, the second charge auxiliary layer 286 is in contact with the top surface of the overcoat layer 155 exposed through the second opening 270c in the first transparent area TA1.

Alternatively, the second charge auxiliary layer 286 can be formed through the solution process. In this case, the second charge auxiliary layer 286 can be formed only in the first opening 270a similarly to the first charge auxiliary layer 282 and the light-emitting material layer 284 and a height of the second charge auxiliary layer 286 in the region adjacent to the second bank 274 can rise as it gets closer to the second bank 274.

A second electrode 290 of a conductive material having a relatively low work function is formed on the light-emitting layer 280, the second bank 274, the connection pattern 162, and the auxiliary connection pattern 264 substantially over the entire surface of the substrate 100, more particularly, substantially all over a display area where the plurality of pixels P is provided. At this time, the second electrode 290 is formed in the whole pixel P excluding the first transparent area TA1. Accordingly, the second electrode 290 is not formed in the first transparent area TA1, and the second electrode 290 is formed in the emission area EA and the second transparent area TA2 and also formed between the emission area EA and the transparent area TA.

The second electrode 290 can be formed of aluminum (Al), magnesium (Mg), silver (Ag), or an alloy thereof. At this time, the second electrode 190 has a relatively thin thickness such that light from the light-emitting layer 180 can be transmitted therethrough. For example, the second electrode 190 can have the thickness of 5 nm to 10 nm.

The second electrode 290 is electrically connected to the connection pattern 162 through the auxiliary contact hole 270b. At this time, the second electrode 290 can be electrically connected to the connection pattern 162 through the auxiliary connection pattern 264 on the auxiliary connection pattern 162.

In addition, the second electrode 290 is electrically connected to the auxiliary connection pattern 264 through the third opening 270d. The second charge auxiliary layer 286 is disposed between the second electrode 290 and the connection pattern 264. Accordingly, the area for electrical connection of the second electrode 290 increases, so that the electrical contact property between the second electrode 290 and the connection pattern 162 can be improved.

Alternatively, as described above, the second charge auxiliary layer 286 can be formed through the solution process, and in this case, the second electrode 290 can be in direct contact with the auxiliary connection pattern 264.

The first electrode 160, the light-emitting layer 280 and the second electrode 290 constitute a light-emitting diode De. The first electrode 160 can serve as an anode, and the second electrode 290 can serve as a cathode, but is not limited thereto.

Meanwhile, an anti-deposition layer 295 is formed on the overcoat layer 155 exposed in the first transparent area TA1.

The anti-deposition layer 295 is formed through a solution process using an organic material. Accordingly, a height of the anti-deposition layer 295 in the region adjacent to the second bank 274 rise as it gets closer to the second bank 274, and the height of the anti-deposition layer 295 at an edge of the first transparent area TA1 is higher than the height of the anti-deposition layer 295 at a center of the first transparent area TA1.

The anti-deposition layer 295 can be formed of one of materials represented by Formula Formulas 1 to 3.

The anti-deposition layer 295 exhibits a relatively low probability of initial fixation, thereby preventing the second electrode 290 from being formed in the first transparent area TA1. At this time, the anti-deposition layer 295 is transparent, and the transmittance of the anti-deposition layer 295 is higher than the transmittance of the second electrode 290. The thickness of the second electrode 290 adjacent to the first transparent area TA1 is thicker than the thickness of the second electrode 290 on the light-emitting layer 280 due to the anti-deposition layer 295.

As described above, in the transparent display device 2000 according to the second embodiment of the present disclosure, the pixel P includes the emission area EA and the transparent area TA, so that the surrounding environment information such as backgrounds can be shown together through the transparent area TA while displaying the image information through the emission area EA.

In addition, in the transparent display device 2000 according to the second embodiment of the present disclosure, by forming some of the light-emitting layer 180 through the solution process, a fine metal mask can be omitted to thereby reduce the manufacturing costs, and a display device with a large size and high definition can be implemented.

Further, the transparent display device 2000 according to the second embodiment of the present disclosure is implemented as the top emission type, thereby improving the luminance and reducing the power consumption. Here, since the second electrode 290 is formed to have the relatively thin thickness in order to transmit light, the resistance of the second electrode 290 can be increased, but the resistance of the second electrode 290 can be lowered by connecting the second electrode 290 to the first and second auxiliary electrodes 114 and 146 through the connection pattern 162. At this time, the second electrode 290 is also electrically connected to the auxiliary connection pattern 264 in the second transparent area TA2, so that the electrical contact property between the second electrode 290 and the connection pattern 162 can be improved.

Moreover, in the transparent display device 2000 according to the second embodiment of the present disclosure, the anti-deposition layer 295 is formed in the first transparent area TA1, thereby preventing the second electrode 290 from being deposited in the first transparent area TA1. Accordingly, the transmittance of the first transparent area TA1 increases, and the transmittance of the transparent area TA increases, so that clearer surrounding environment information can be provided.

A manufacturing method of the transparent display device 2000 according to the second embodiment of the present disclosure will be described in detail with reference to FIGS. 7A to 7F.

Figure 7A:
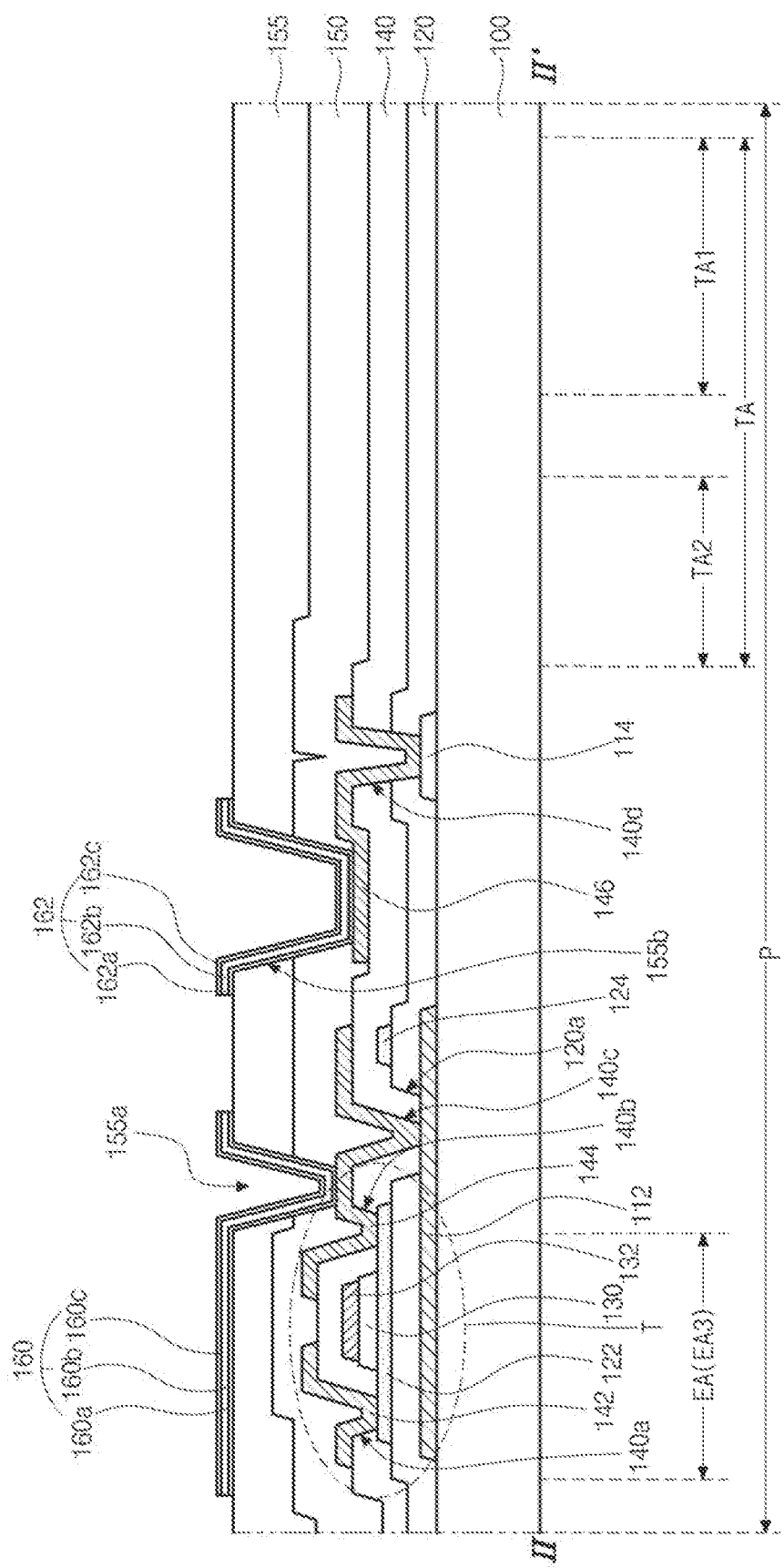
FIGS. 7A to 7F are cross-sectional views schematically illustrating a manufacturing process of the transparent display device of FIG. 6 according to the second embodiment of the present disclosure.

FIGS. 7A to 7F are cross-sectional views schematically illustrating a transparent display device in steps of a manufacturing process of the same according to the second embodiment of the present disclosure and correspond to the line II-II' of FIG. 5. In the manufacturing method of the transparent display device according to the second embodiment of the present disclosure, steps up to formation of a first electrode of FIG. 7A are the same as the steps of FIG. 4A of the first embodiment, and explanation for the same steps will be omitted or shortened.

In FIG. 7A, a light-blocking pattern 112, a first auxiliary electrode 114, a buffer layer 120, a semiconductor layer 122, a capacitor electrode 124, a gate insulation layer 130, a gate electrode, an interlayer insulation layer 140, source and drain electrodes 142 and 144, a second auxiliary electrode 146, a passivation layer 150, an overcoat layer 155, a first electrode, and a connection pattern 162 are formed on an insulation substrate 100, where a pixel P including an emission area EA and a transparent area TA is defined, through first to eighth mask processes. The transparent area TA includes a first transparent area TA1 and a second transparent area TA2.

The first electrode 160 and the connection pattern 162 each include a first layer 160a and 162a, a second layer 160b and 162b, and a third layer 160c and 162c. The second layer 160b and 162b is disposed between the first layer 160a and 162a and the third layer 160c and 162c, and the first layer 160a and 162a is disposed between the second layer 160b and 162b and the overcoat layer 155.

The first electrode 160 is disposed in the emission area EA and is in contact with the drain electrode 144 through the drain contact hole 155a. In addition, the connection pattern 162 is disposed between the emission area EA and the transparent area TA and is in contact with the second auxiliary electrode 146 through the fifth contact hole 155b.

Figure 7B:
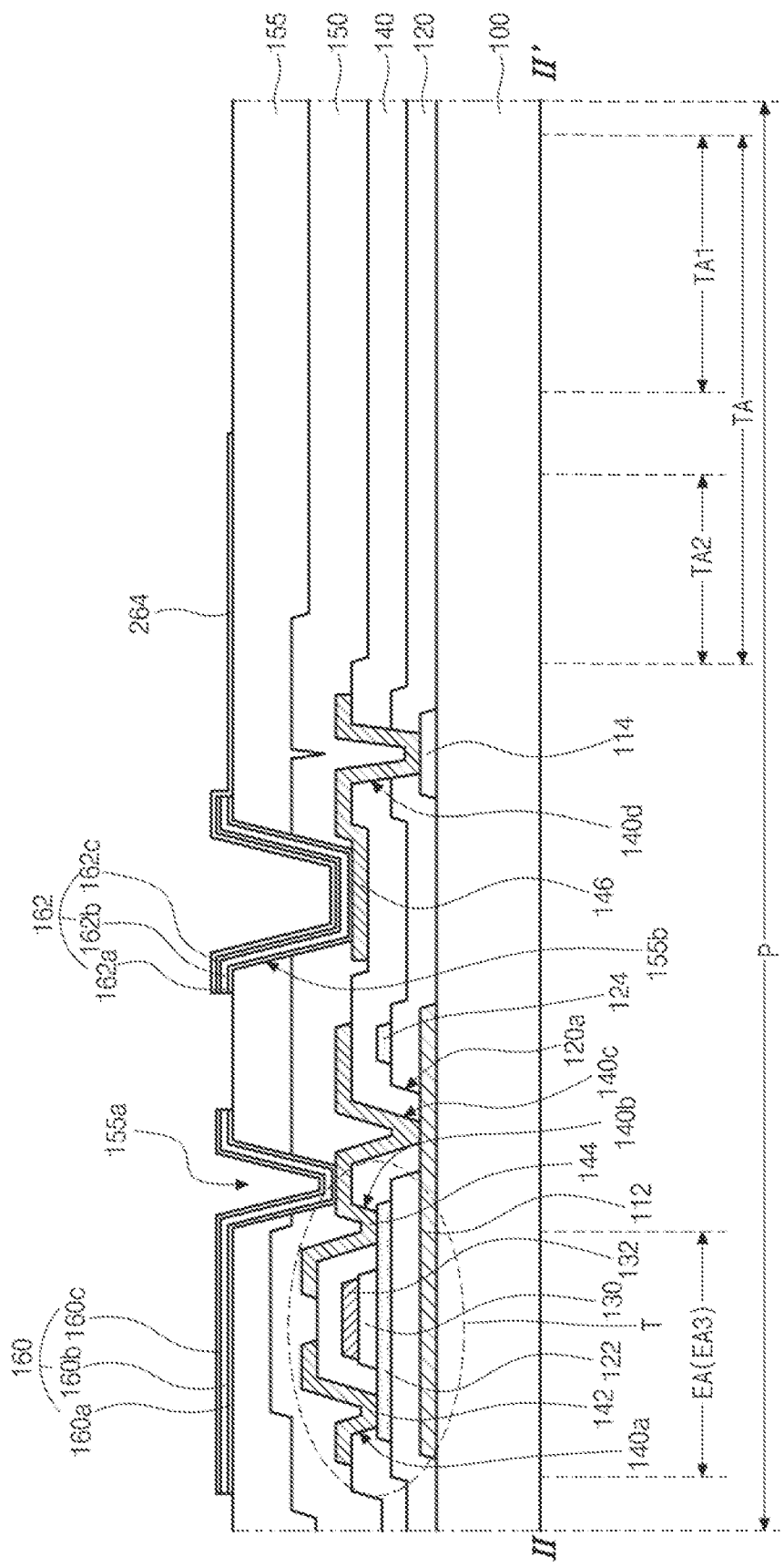

Next, in FIG. 7B, an auxiliary connection pattern 264 is formed in the second transparent area TA2 by depositing a transparent conductive layer on the first electrode 160 and the connection pattern 162 and patterning it through a ninth mask process.

The auxiliary connection pattern 264 extends into an area between the emission area EA and the transparent area TA and overlaps and covers the connection pattern 162. The auxiliary connection pattern 264 can be formed of a transparent conductive material such as ITO or IZO.

Figure 7C:
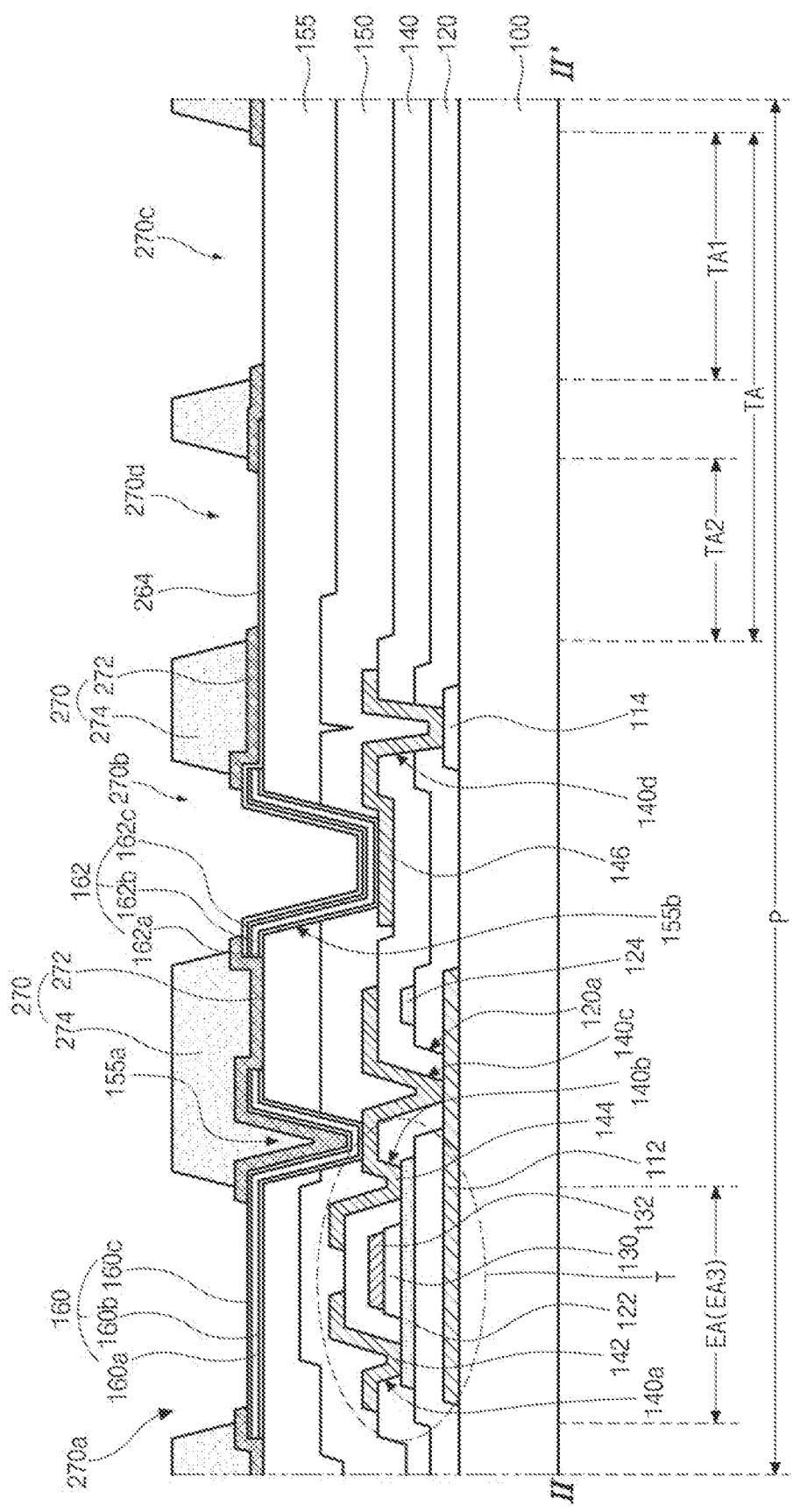

In FIG. 7C, a bank 270 including a first bank 272 of a hydrophilic property and a second bank 274 of a hydrophobic property is formed on the first electrode 160 and the auxiliary connection pattern 264 by depositing or applying an insulating material and patterning it through one mask process or two mask processes.

The bank 270 has a first opening 270a corresponding to the emission area EA, a second opening 270c corresponding to the first transparent area TA1, a third opening 270d corresponding to the second transparent area TA2, and an auxiliary contact hole 270b between the emission area EA and the transparent area TA.

The first opening 270a exposes a central portion of the first electrode 160, the second opening 270c exposes a top surface of the overcoat layer 155, a third opening 270d exposes a central portion of the auxiliary connection pattern 264, and the auxiliary contact hole 270b exposes a part of the connection pattern 162.

Figure 7D:
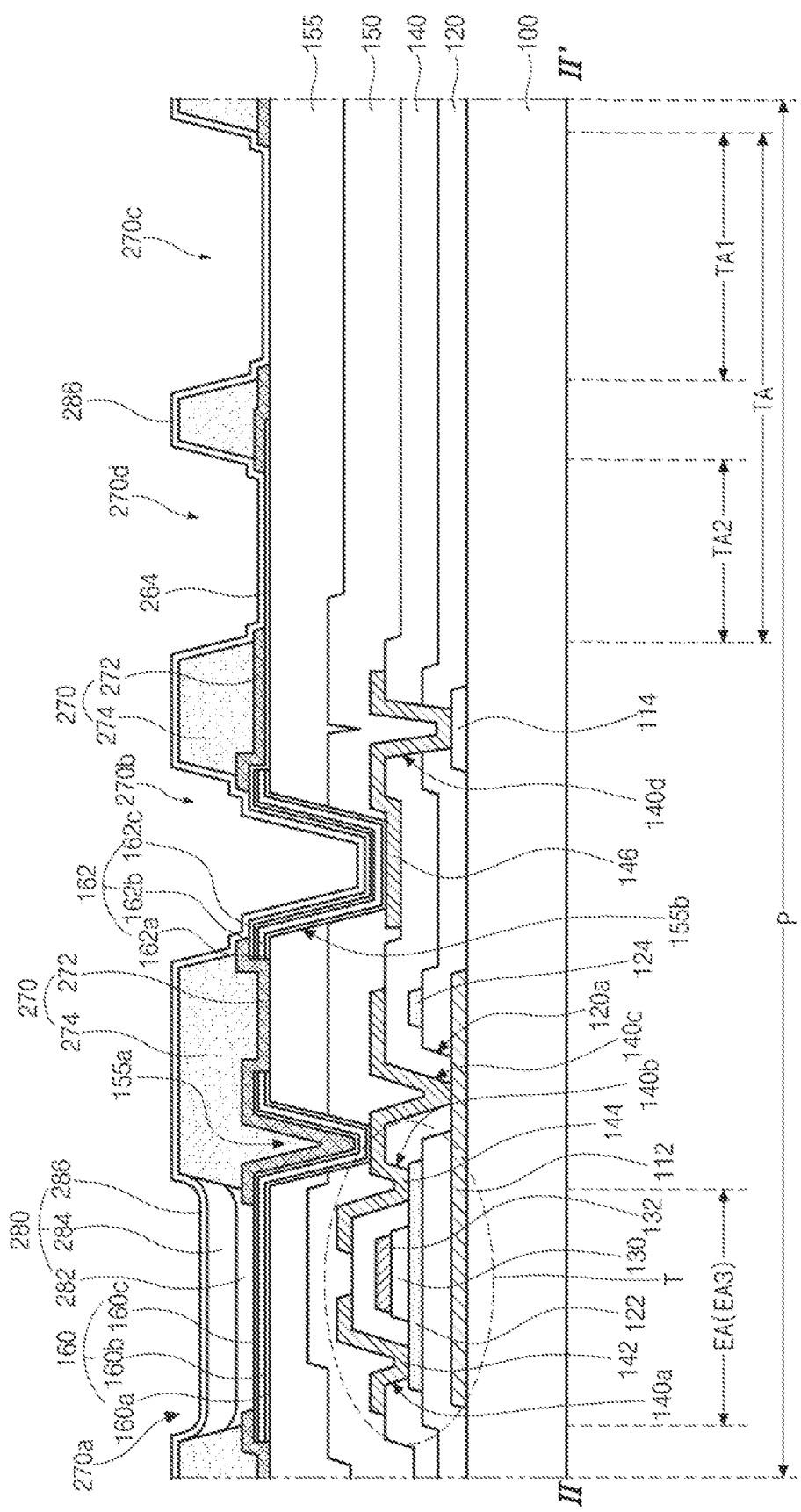

Next, in FIG. 7D, a first charge auxiliary layer 282 is formed on the first electrode 160 exposed by the bank 270 by dropping a first solution and drying it. At least one side surface of the first charge auxiliary layer 282 is enclosed by the second bank 274. When the first solution is dried, a drying speed of a solvent in a region adjacent to the second bank 274 is different from that in other regions, and thus a height of the first charge auxiliary layer 282 in the region adjacent to the second bank 274 rises as it gets closer to the second bank 274. The first charge auxiliary layer 282 can be a hole injecting layer (HIL) and/or a hole transporting layer (HTL).

Then, a light-emitting material layer 284 is formed on the first charge auxiliary layer 282 by dropping a second solution and drying it. At least one side surface of the light-emitting material layer 284 is enclosed by the second bank 274. When the second solution is dried, a drying speed of a solvent in the region adjacent to the second bank 274 is different from that in other regions, and thus a height of the light-emitting material layer 284 in the region adjacent to the second bank 274 rises as it gets closer to the second bank 274.

Next, a second charge auxiliary layer 286 is formed on the light-emitting material layer 284 by depositing an organic material and/or an inorganic material. The second charge auxiliary layer 286 is formed substantially over the entire surface of the substrate 100. Accordingly, the second charge auxiliary layer 286 is also formed on the second bank 274, the auxiliary connection pattern 264 in the auxiliary contact hole 270b, and the auxiliary connection pattern 264 in the second transparent area TA2. The second charge auxiliary layer 286 can be an electron injecting layer (EIL) and/or an electron transporting layer (ETL).

The first charge auxiliary layer 282, the light-emitting material layer 284, and the second charge auxiliary layer 286 constitute a light-emitting layer 280.

Figure 7E:
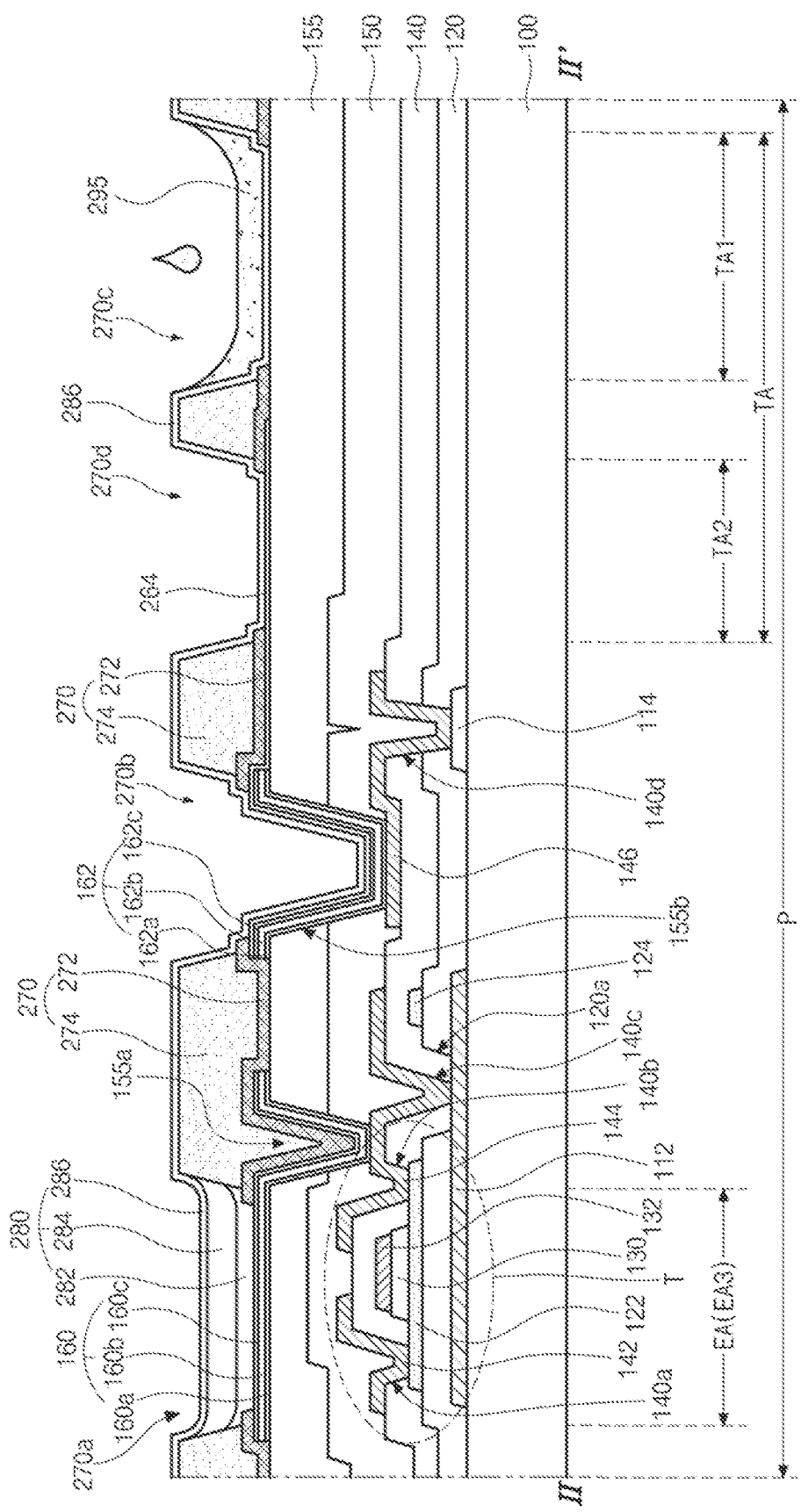

In FIG. 7E, an anti-deposition layer 295 is formed on the overcoat layer 155 exposed through the second opening 270c of the bank 270 by dropping a solution and drying it. Side surfaces of the anti-deposition layer 295 are surrounded by the second bank 274. When the solution is dried, a drying speed of a solvent in a region adjacent to the second bank 274 is different from that in other regions, and thus a height of the anti-deposition layer 295 in the region adjacent to the second bank 274 rises as it gets closer to the second bank 274.

The anti-deposition layer 295 can be formed of one of materials represented by Formula Formulas 1 to 3. At this time, the solvent can be at least one, beneficially, two or three mixed solvents, selected from aromatic ester derivatives, aromatic ether derivatives, aromatic hydrocarbon derivatives, and aromatic ketone derivatives.

Figure 7F:
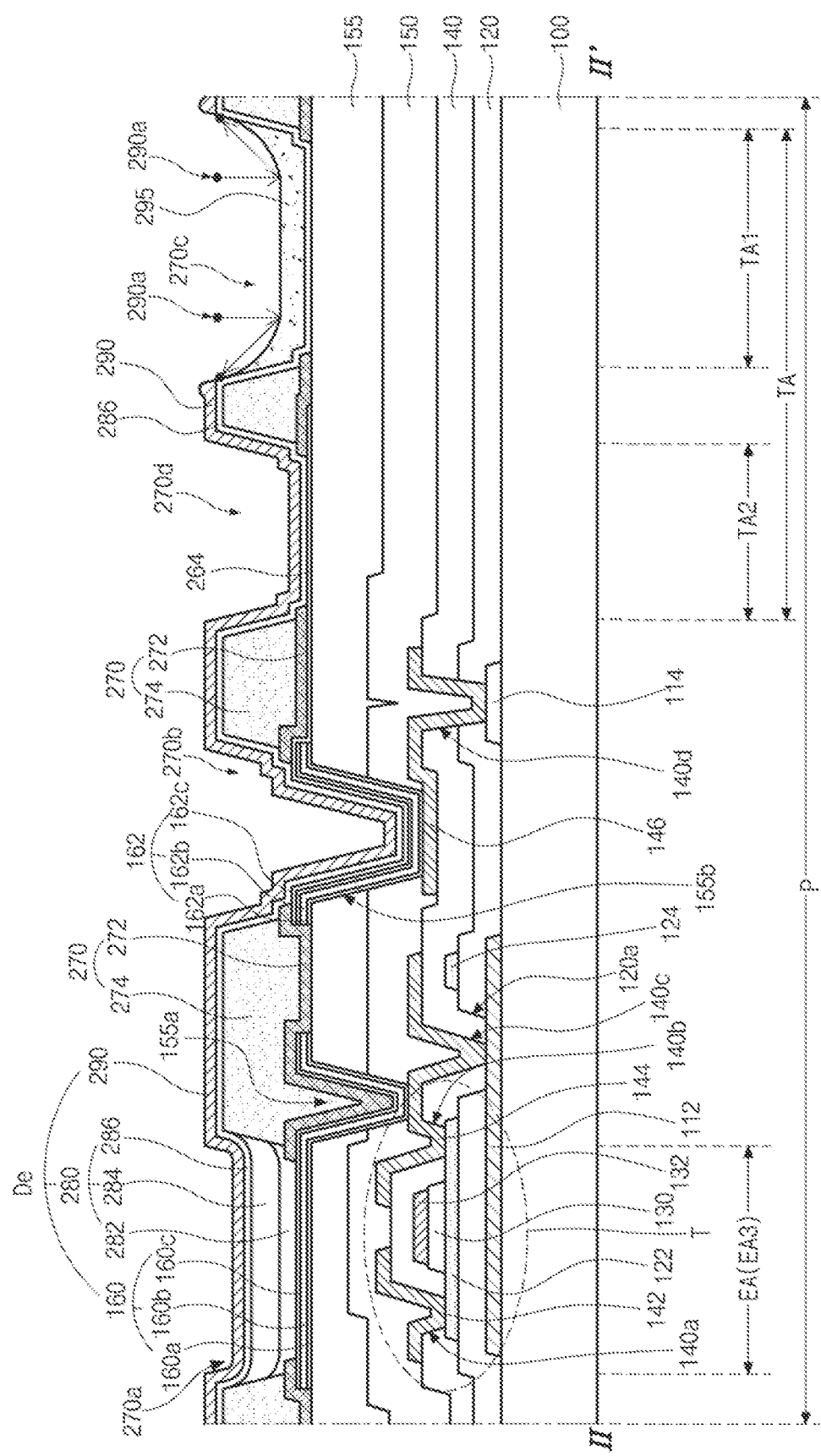

Next, in FIG. 7F, a second electrode 290 is formed on the light-emitting layer 280 by depositing a conductive material 290a such as metal. The second electrode 290 is formed substantially over the entire surface of the substrate 100 except form the first transparent area TA1.

The second electrode 290 is electrically connected to the connection pattern 162 through the auxiliary contact holes 270b. In addition, the second electrode 290 is electrically connected to the auxiliary connection pattern 264 through the third opening 270d.

The surface of the anti-deposition layer 295 formed in the first transparent area TA1 has a relatively low affinity with the conductive material 290a compared to surfaces of other layers, for example, the surfaces of the light-emitting layer 280 and the bank 270. For example, the surface of the anti-deposition layer 295 exhibits a relatively low probability of initial fixation compared to the surfaces of the light-emitting layer 280 and the bank 270. Accordingly, the conductive material 290a deposited onto the anti-deposition layer 295 in the first transparent area TA1 is not fixed to the surface of the anti-deposition layer 295 and moves toward the bank 270 having a relatively high affinity, thereby migrating outside the first transparent area TA1. Accordingly, the second electrode 290 is not formed in the first transparent area TA1, and the thickness of the edge of the second electrode 290 is thicker than other portions. Namely, the thickness of the second electrode 290 adjacent to the anti-deposition layer 295 of the first transparent area TA1 is thicker than the thickness of the second electrode 290 on the light-emitting layer 280 of the emission area EA.

The first electrode 160, the light-emitting layer 280, and the second electrode 290 constitute a light-emitting diode De. The first electrode 160 can serve as an anode, and the second electrode 290 can serve as a cathode.

As described above, in the transparent display device 2000 according to the second embodiment of the present disclosure, after forming the first electrode 160 and the connection pattern 162, the auxiliary connection pattern 264 directly connected to the connection pattern 162 is formed in the second transparent area TA2, and the second electrode 290 is electrically connected to the first and second auxiliary electrodes 114 and 146 through the connection pattern 162 and the auxiliary connection pattern 264. Accordingly, while lowering the resistance of the second electrode 290, the area for electrical connection of the second electrode 290 increases, so that the electrical contact property between the second electrode 290 and the connection pattern 162 can be improved.

Meanwhile, the electrical property can be lowered due to the second charge auxiliary layer 286 between the second electrode 290 and the connection pattern 162. However, since the second electrode 290 is electrically connected to the auxiliary connection pattern 264 in the second transparent area TA2 having a relatively large area, it is possible to minimize a decrease in the electrical contact property between the second electrode 290 and the connection pattern 162.

The manufacturing method of the transparent display device 2000 according to the second embodiment of the present disclosure has an advantage that it can be implemented without changing the existing process because only a step for forming the auxiliary connection pattern 264 is added.

In addition, the anti-deposition layer 295 is formed in the first transparent area TA1, thereby preventing the second electrode 290 from being formed in the first transparent area TA1. Therefore, the transmittance of the transparent area TA can be improved. The anti-deposition layer 295 is formed through the solution process, so that the second electrode 290 can be patterned without a photolithographic process using a photomask, and it is possible to simplify the manufacturing processes of the display device.

Figure 8:
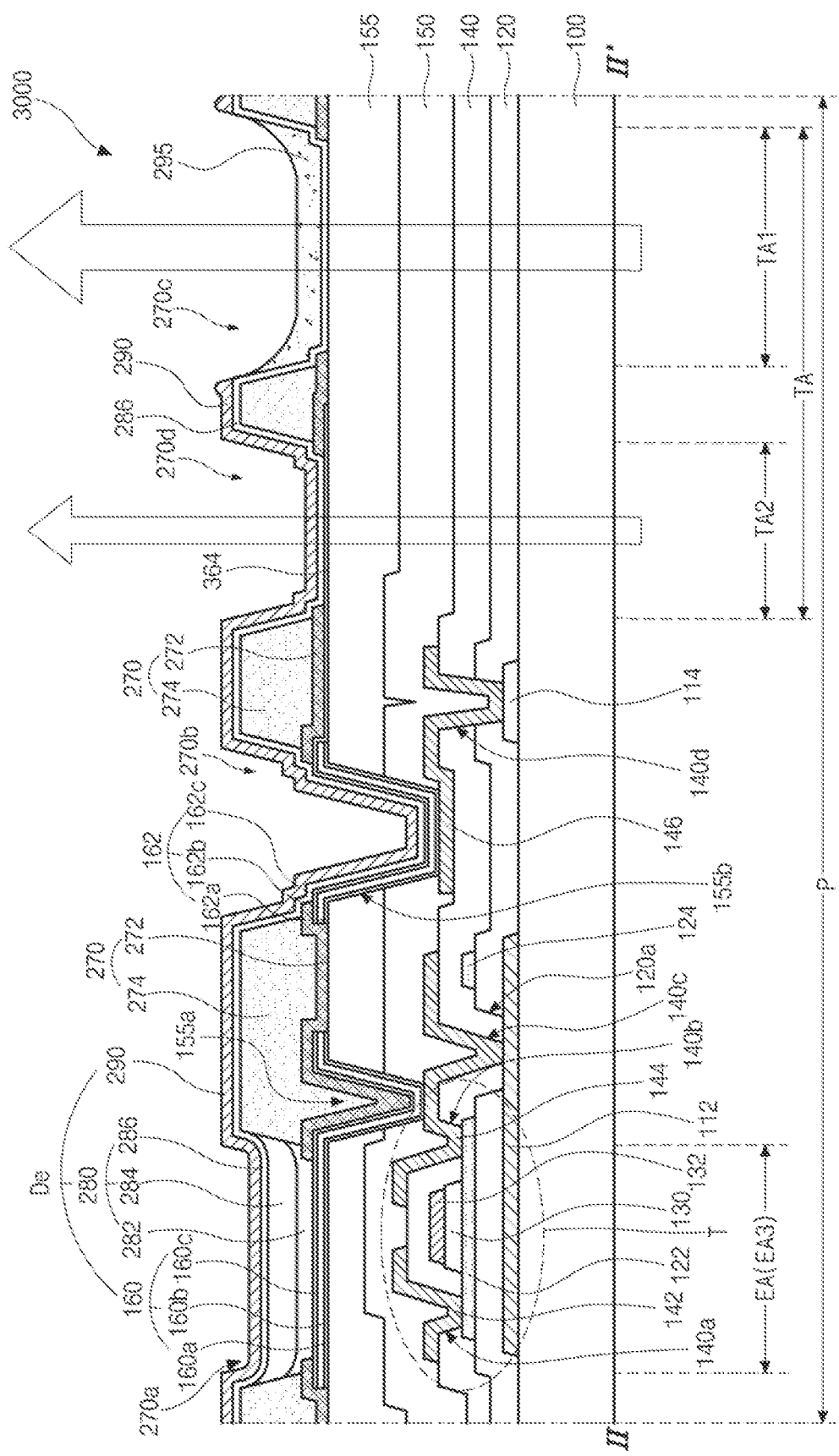
FIG. 8 is a schematic cross-sectional view of a transparent display device according to a third embodiment of the present disclosure.

FIG. 8 is a schematic cross-sectional view of a transparent display device according to a third embodiment of the present disclosure. The transparent display device of the third embodiment has substantially the same configuration as that of the second embodiment except for an auxiliary connection pattern. The same parts as those of the second embodiment are designated by the same reference signs, and explanation for the same parts will be omitted or shortened.

As shown in FIG. 8, in the transparent display device 3000 according to the third embodiment of the present disclosure, a pixel P including an emission area EA and a transparent area TA is defined on a substrate 100. A first electrode 160, a connection pattern 162, and an auxiliary connection pattern 364 are formed over the substrate 100. The transparent area TA includes a first transparent area TA1 and a second transparent area TA2.

The first electrode 160 is disposed in the emission area EA, the auxiliary connection pattern 364 is disposed in the second transparent area TA2, and the connection pattern 162 is disposed between the emission area EA and the transparent area TA.

The first electrode 160 and the connection pattern 162 each include a first layer 160a and 162a, a second layer 160b and 162b, and a third layer 160c and 162c.

The auxiliary connection pattern 364 is directly connected to and is in direct contact with the connection pattern 162. The auxiliary connection pattern 364 extends from the third layer 162c of the connection pattern 162. For example, the auxiliary connection pattern 364 can be formed as one body with the third layer 162c of the connection pattern 162 and can be in contact with side surfaces of the first and second layers 162a and 162b of the connection pattern 162.

The first electrode 160, the connection pattern 162, and the auxiliary connection pattern 364 are formed through two mask processes. More particularly, the first layers 160a and 162a and the second layers 160b and 162b of the first electrode 160 and the connection pattern 162 are formed by depositing first and second conductive layers and patterning them through a mask process, and the third layers 160c and 162c of the first electrode 160 and the connection pattern 162 and the auxiliary connection pattern 364 are formed by depositing a third conductive layer and patterning it through another mask process.

A bank 270 of an insulating material is formed on the first electrode 160, the connection pattern 162, and the auxiliary connection pattern 364. The bank 270 has a first opening 270a, a second opening 270c, a third opening 270d, and an auxiliary contact hole 270b. The bank 270 includes a first bank 272 of a hydrophilic property and a second bank 274 of a hydrophobic property.

A light-emitting layer 280 is formed on the first electrode 160 exposed through the first opening 270a. The light-emitting layer 280 can include a first charge auxiliary layer 282, a light-emitting material layer 284, and a second charge auxiliary layer 286.

Here, each of the first charge auxiliary layer 282 and the light-emitting material layer 284 is formed through a solution process. A height of each of the first charge auxiliary layer 282 and the light-emitting material layer 284 in the region adjacent to the second bank 274 can rise due to a difference in the drying speed according to the location as it gets closer to the second bank 274.

On the other hand, the second charge auxiliary layer 286 is formed substantially over the entire surface of the substrate 100 through a thermal evaporation process. Accordingly, the second charge auxiliary layer 286 contacts top and side surfaces of the second bank 274 and also contacts the connection pattern 162 and the auxiliary connection pattern 364. Further, the second charge auxiliary layer 286 is disposed in the first and second transparent areas TA1 and TA2.

A second electrode 290 is formed on the light-emitting layer 280, the second bank 274, the connection pattern 162, and the auxiliary connection pattern 364 substantially over the entire surface of the substrate 100, more particularly, substantially all over a display area where the plurality of pixels P is provided. At this time, the second electrode 290 is formed in the whole pixel P excluding the first transparent area TA1. Accordingly, the second electrode 290 is not formed in the first transparent area TA1, and the second electrode 290 is formed in the emission area EA and the second transparent area TA2 and also formed between the emission area EA and the transparent area TA.

The second electrode 290 is electrically connected to the connection pattern 162 through the auxiliary contact hole 270b. In addition, the second electrode 290 is electrically connected to the auxiliary connection pattern 364 through the third opening 270d.

Meanwhile, an anti-deposition layer 295 is formed on the overcoat layer 155 exposed in the first transparent area TA1. The anti-deposition layer 295 is formed through a solution process using an organic material. Accordingly, a height of the anti-deposition layer 295 in the region adjacent to the second bank 274 rise as it gets closer to the second bank 274, and the height of the anti-deposition layer 295 at an edge of the first transparent area TA1 is higher than the height of the anti-deposition layer 295 at a center of the first transparent area TA1.

The anti-deposition layer 295 can be formed of one of materials represented by Formula Formulas 1 to 3.

The anti-deposition layer 295 exhibits a relatively low probability of initial fixation, thereby preventing the second electrode 290 from being formed in the first transparent area TA1. Accordingly, the transmittance of the first transparent area TA1 increases, so that the transmittance of the transparent area TA can increase. The thickness of the second electrode 290 adjacent to the first transparent area TA1 is thicker than the thickness of the second electrode 290 on the light-emitting layer 280 due to the anti-deposition layer 295.

As described above, in the transparent display device 3000 according to the third embodiment of the present disclosure, the auxiliary connection pattern 364 connected to the connection pattern 162 is formed in the second transparent area TA2 when the third layers 160c and 162c of the first electrode 160 and the connection pattern 162 are formed, and the second electrode 290 is electrically connected to the connection pattern 162 and the auxiliary connection pattern 364.

The transparent display device 3000 according to the third embodiment of the present disclosure has an advantage that the manufacturing process and material can be decreased compared to the second embodiment.

Figure 9:
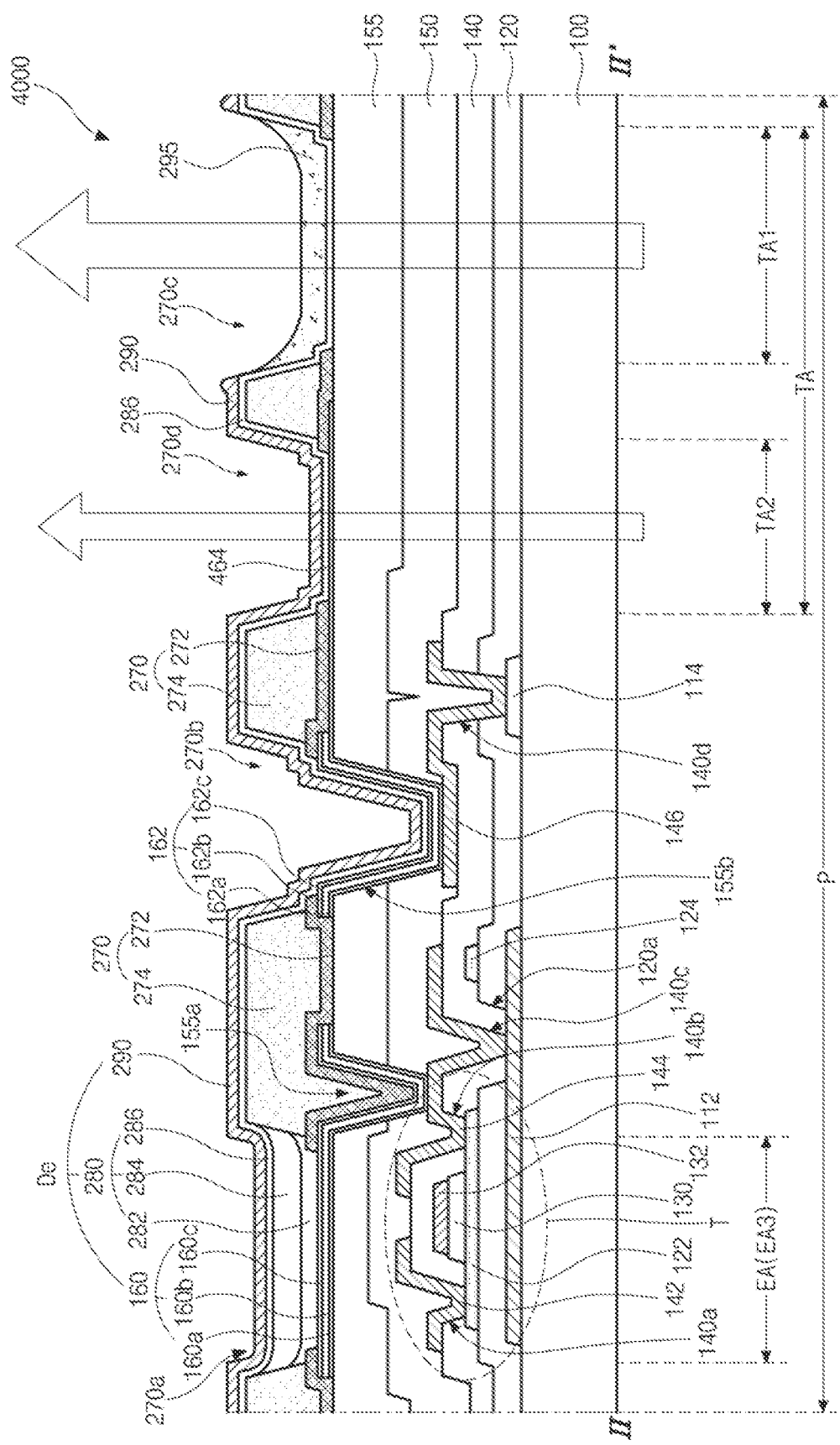
FIG. 9 is a schematic cross-sectional view of a transparent display device according to a fourth embodiment of the present disclosure.

FIG. 9 is a schematic cross-sectional view of a transparent display device according to a fourth embodiment of the present disclosure. The transparent display device of the fourth embodiment has substantially the same configuration as that of the second embodiment except for an auxiliary connection pattern. The same parts as those of the second embodiment are designated by the same reference signs, and explanation for the same parts will be omitted or shortened.

As shown in FIG. 9, in the transparent display device 4000 according to the fourth embodiment of the present disclosure, a pixel P including an emission area EA and a transparent area TA is defined on a substrate 100. A first electrode 160, a connection pattern 162, and an auxiliary connection pattern 464 are formed over the substrate 100. The transparent area TA includes a first transparent area TA1 and a second transparent area TA2.

The first electrode 160 is disposed in the emission area EA, the auxiliary connection pattern 464 is disposed in the second transparent area TA2, and the connection pattern 162 is disposed between the emission area EA and the transparent area TA.

The first electrode 160 and the connection pattern 162 each include a first layer 160a and 162a, a second layer 160b and 162b, and a third layer 160c and 162c.

The auxiliary connection pattern 464 is directly connected to and is in direct contact with the connection pattern 162. The auxiliary connection pattern 464 extends from the first layer 162a of the connection pattern 162. For example, the auxiliary connection pattern 464 can be formed as one body with the first layer 162a of the connection pattern 162.

The first electrode 160, the connection pattern 162, and the auxiliary connection pattern 464 can be formed through two mask processes. More particularly, the first layers 160a and 162a of the first electrode 160 and the connection pattern 162 and the auxiliary connection pattern 464 are formed by depositing a first conductive layer and patterning it through a mask process, and the second layers 160b and 162b and the third layers 160c and 162c of the first electrode 160 and the connection pattern 162 are formed by depositing second and third conductive layers and patterning them through another mask process.

Alternatively, the first electrode 160, the connection pattern 162, and the auxiliary connection pattern 464 can be formed through one mask process using a halftone mask that includes a light-transmitting portion, a light-blocking portion and a half light-transmitting portion. At this time, the half light-transmitting portion can correspond to the auxiliary connection pattern 464.

A bank 270 of an insulating material is formed on the first electrode 160, the connection pattern 162, and the auxiliary connection pattern 464. The bank 270 has a first opening 270a, a second opening 270c, a third opening 270d, and an auxiliary contact hole 270b. The bank 270 includes a first bank 272 of a hydrophilic property and a second bank 274 of a hydrophobic property.

A light-emitting layer 280 is formed on the first electrode 160 exposed through the first opening 270a. The light-emitting layer 280 can include a first charge auxiliary layer 282, a light-emitting material layer 284, and a second charge auxiliary layer 286.

Here, each of the first charge auxiliary layer 282 and the light-emitting material layer 284 is formed through a solution process. A height of each of the first charge auxiliary layer 282 and the light-emitting material layer 284 in the region adjacent to the second bank 274 can rise due to a difference in the drying speed according to the location as it gets closer to the second bank 274.

On the other hand, the second charge auxiliary layer 286 is formed substantially over the entire surface of the substrate 100 through a thermal evaporation process. Accordingly, the second charge auxiliary layer 286 contacts top and side surfaces of the second bank 274 and also contacts the connection pattern 162 and the auxiliary connection pattern 464. Further, the second charge auxiliary layer 286 is disposed in the first and second transparent areas TA1 and TA2.

A second electrode 290 is formed on the light-emitting layer 280, the second bank 274, the connection pattern 162, and the auxiliary connection pattern 464 substantially over the entire surface of the substrate 100, more particularly, substantially all over a display area where the plurality of pixels P is provided. At this time, the second electrode 290 is formed in the whole pixel P excluding the first transparent area TA1. Accordingly, the second electrode 290 is not formed in the first transparent area TA1, and the second electrode 290 is formed in the emission area EA and the second transparent area TA2 and also formed between the emission area EA and the transparent area TA.

The second electrode 290 is electrically connected to the connection pattern 162 through the auxiliary contact hole 270b. In addition, the second electrode 290 is electrically connected to the auxiliary connection pattern 464 through the third opening 270d.

Meanwhile, an anti-deposition layer 295 is formed on the overcoat layer 155 exposed in the first transparent area TA1. The anti-deposition layer 295 is formed through a solution process using an organic material. Accordingly, a height of the anti-deposition layer 295 in the region adjacent to the second bank 274 rise as it gets closer to the second bank 274, and the height of the anti-deposition layer 295 at an edge of the first transparent area TA1 is higher than the height of the anti-deposition layer 295 at a center of the first transparent area TA1.

The anti-deposition layer 295 can be formed of one of materials represented by Formula Formulas 1 to 3.

The anti-deposition layer 295 exhibits a relatively low probability of initial fixation, thereby preventing the second electrode 290 from being formed in the first transparent area TA1. Accordingly, the transmittance of the first transparent area TA1 increases, so that the transmittance of the transparent area TA can increase. The thickness of the second electrode 290 adjacent to the first transparent area TA1 is thicker than the thickness of the second electrode 290 on the light-emitting layer 280 due to the anti-deposition layer 295.

As described above, in the transparent display device 4000 according to the fourth embodiment of the present disclosure, the auxiliary connection pattern 464 connected to the connection pattern 162 is formed in the second transparent area TA2 when the first layers 160a and 162a of the first electrode 160 and the connection pattern 162 are formed, and the second electrode 290 is electrically connected to the connection pattern 162 and the auxiliary connection pattern 464.

The transparent display device 4000 according to the fourth embodiment of the present disclosure has an advantage that the manufacturing process and material can be decreased compared to the second embodiment.

Figure 10:
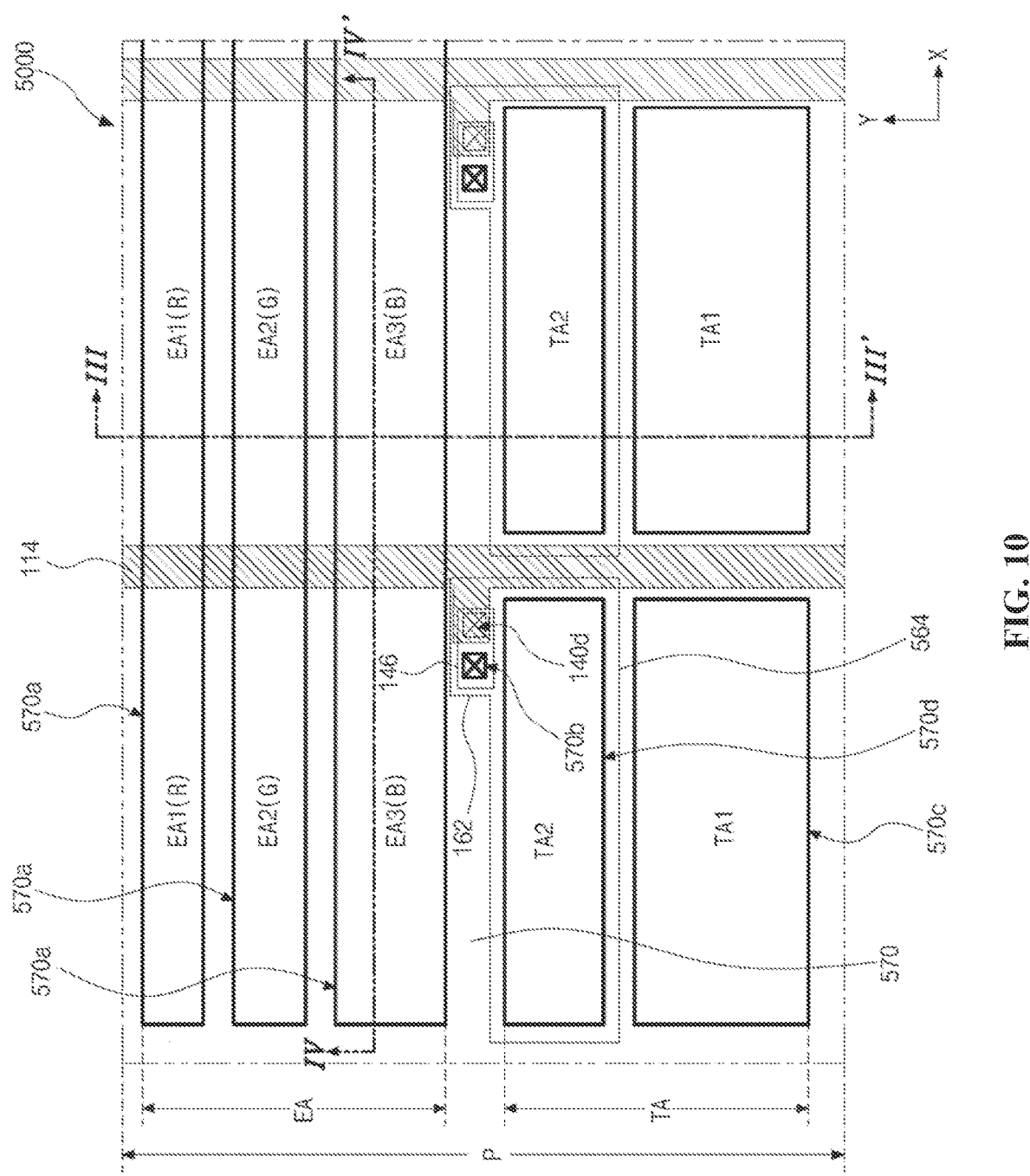
FIG. 10 is a schematic plan view of a transparent display device according to a fifth embodiment of the present disclosure.

FIG. 10 is a schematic plan view of a transparent display device according to a fifth embodiment of the present disclosure and mainly shows a bank configuration. The transparent display device of the fifth embodiment has substantially the same configuration as that of the second embodiment except for an emission area and a transparent area. The same parts as those of the first embodiment are designated by the same reference signs, and explanation for the same parts will be shortened or omitted.

As shown in FIG. 10, in the transparent display device 5000 according to the fifth embodiment of the present disclosure, one pixel P includes an emission area EA and a transparent area TA. At this time, one pixel P can include three emission areas EA and two transparent areas TA, and each of the emission areas EA has substantially the same configuration except for the sizes.

More particularly, the pixel P includes first, second, and third sub-pixels, for example, red, green, and blue sub-pixels. The emission area EA can include first, second, and third emission areas EA1, EA2, and EA3 corresponding to the red, green, and blue sub-pixels, respectively. In addition, the transparent area TA includes first and second transparent areas TA1 and TA2, and the first and second transparent areas TA1 and TA2 have different transmittances. Here, the transmittance of the first transparent area TA1 is higher than the transmittance of the transparent area TA2 based on the same area.

The emission area EA and the transparent area TA are arranged along a Y direction. The first, second, and third emission areas EA1, EA2, and EA3 are arranged along the Y direction, and the first and second transparent areas TA1 and TA2 are also arranged along the Y direction. Here, the second transparent area TA2 can be disposed between the emission area EA and the first transparent area TA1.

A bank 570 is formed between adjacent ones of the first, second, and third emission areas EA1, EA2, and EA3 and the first and second transparent areas TA1 and TA2. The bank 570 has a first opening 570a corresponding to each of the first, second, and third emission areas EA1, EA2, and EA3. The bank 570 also has second and third openings 570c and 570d corresponding to the first and second transparent areas TA1 and TA2, respectively. In addition, the bank 570 has an auxiliary contact hole 570b between the emission area EA and the transparent area TA.

Here, one first opening 570a can be provided to correspond to the emission areas EA1, EA2 and EA3 of each sub-pixel row including the same color sub-pixels adjacent to each other along the X direction.

First and second auxiliary electrodes 114 and 146, a connection pattern 162, and an auxiliary connection pattern 564 are formed under the bank 570.

The second auxiliary electrode 146 is disposed between the emission area EA and the transparent area TA and is connected to the first auxiliary electrode 114 through a contact hole 140d.

In addition, the connection pattern 162 is disposed between the emission area EA and the transparent area TA and is connected to the second auxiliary electrode 146 through a contact hole under the auxiliary contact hole 570b.

The auxiliary connection pattern 564 is disposed to correspond to the second transparent area TA2 and is exposed through the third opening 570d.

In the transparent display device 5000 according to the fifth embodiment of the present disclosure, the light-emitting layers of the same color sub-pixels are connected to each other and formed as one body due to the first opening 570a, thereby reducing or minimizing the deviation in the dropping amounts between nozzles and uniformly forming the thicknesses of the light-emitting layers of the sub-pixels. Therefore, the mura is prevented, thereby effectively preventing the image quality of the display device from being lowered.

A cross-sectional structure of the transparent display device 5000 according to the fifth embodiment of the present disclosure will be described in detail with reference to FIGS. 11 and 12.

Figure 11:
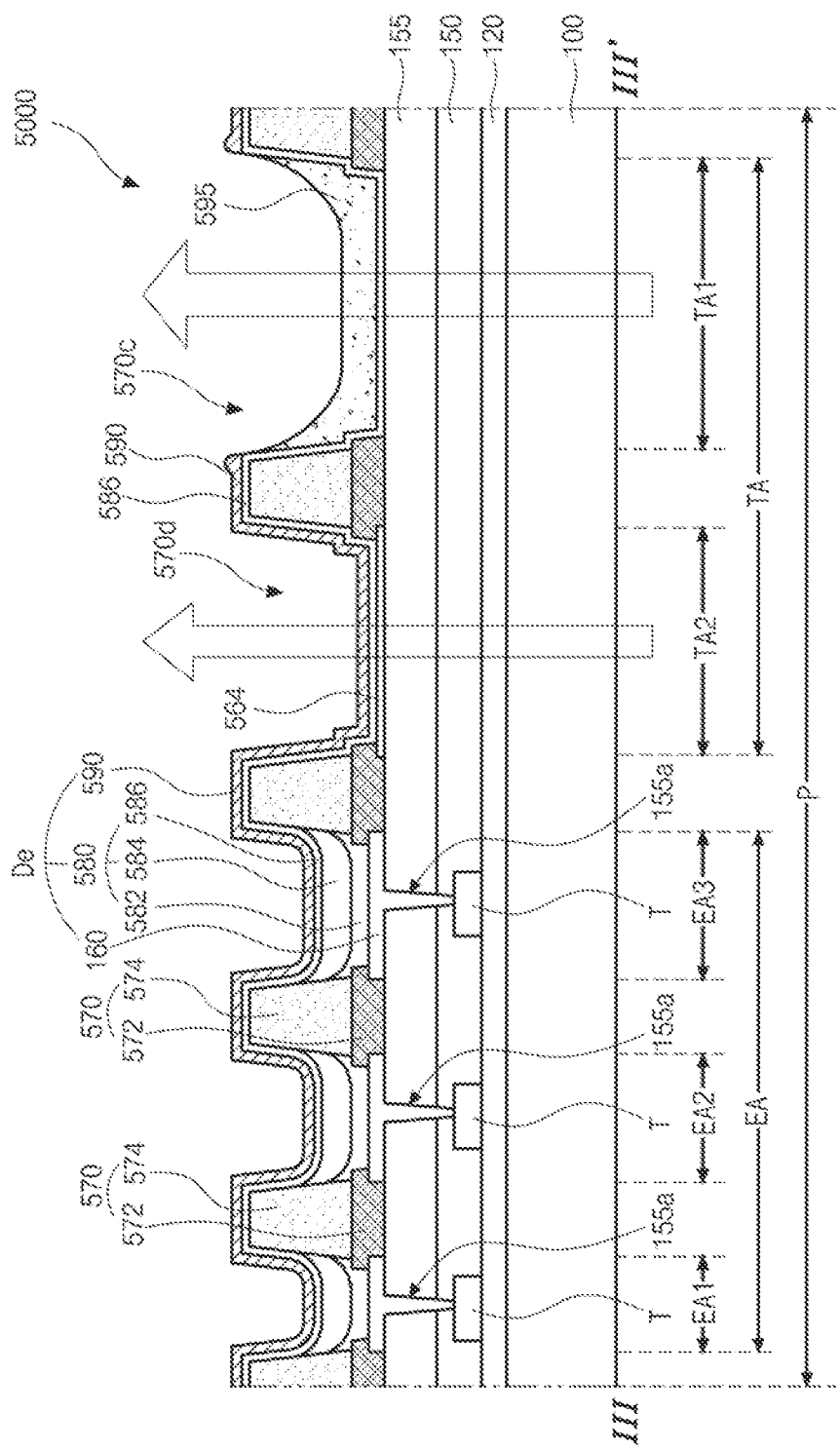
FIG. 11 is a cross-sectional view of the transparent display device, which corresponds to the line of FIG. 10.
Figure 12:
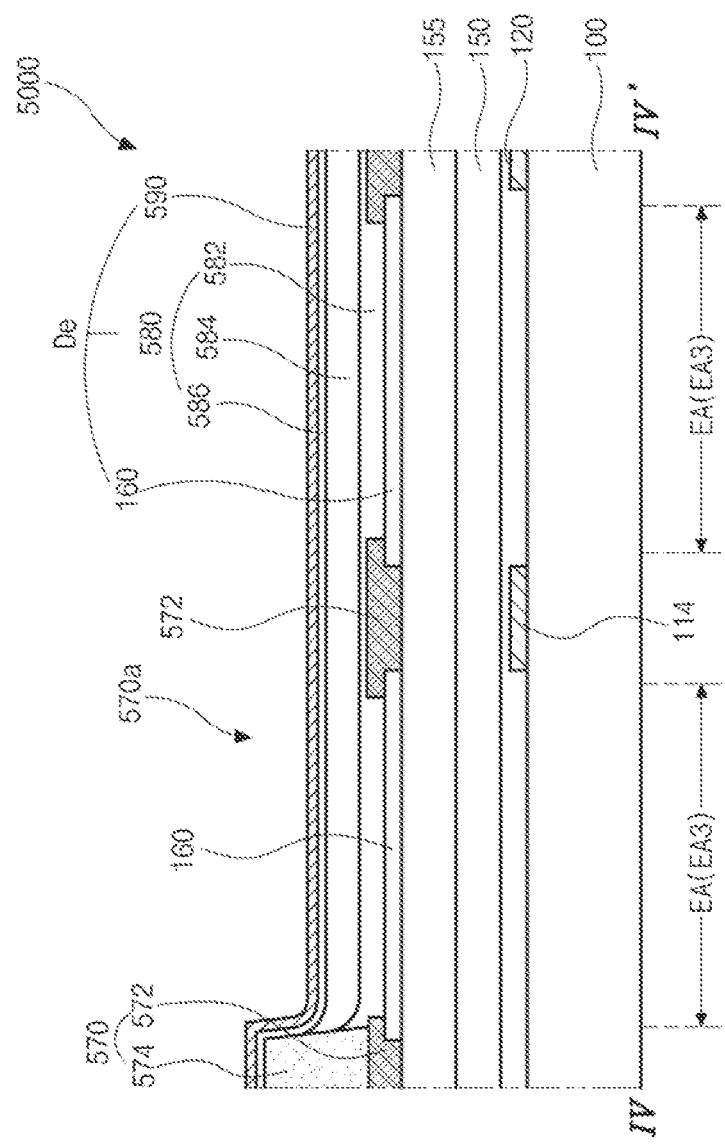
FIG. 12 is a cross-sectional view of the transparent display device, which corresponds to the line IV-IV' of FIG. 10.

FIG. 11 is a cross-sectional view of the transparent display device, which corresponds to the line of FIG. 10, and FIG. 12 is a cross-sectional view of the transparent display device, which corresponds to the line IV-IV' of FIG. 10.

As shown in FIGS. 11 and 12, in the transparent display device 5000 according to the fifth embodiment of the present disclosure, a pixel P including an emission area EA and a transparent area TA is defined on a substrate 100, and a first auxiliary electrode 114 is formed on the substrate 100 between emission areas EA adjacent to each other along an X direction of FIG. 10. A buffer layer 120 is formed on the first auxiliary electrode 114 substantially on the entire surface of the substrate 100, and a thin film transistor T is formed on the buffer layer 120 to correspond to the emission area EA1, EA2, and EA3 of each sub-pixel.

Then, a passivation layer 150 and an overcoat layer 155 are sequentially formed substantially over the entire surface of the substrate 100, and a first electrode 160 is formed on the overcoat layer 155 in the emission area EA1, EA2, and EA3 of each sub-pixel.

The overcoat layer 155 has a drain contact hole 155a exposing a part of the thin film transistor T, for example, a drain electrode of the thin film transistor T together with the passivation layer 150, and the first electrode 160 contacts the drain electrode of the thin film transistor T through the drain contact hole 155a.

Meanwhile, a connection pattern 162 of FIG. 10 is formed on the overcoat layer 155 between the emission area EA and the transparent area TA and formed of the same material as the first electrode 160.

In addition, an auxiliary connection pattern 564 is formed on the overcoat layer 155 in the second transparent area TA2 and formed of a transparent conductive material.

Next, a bank 570 is formed on the first electrode 160, the connection pattern 162, and the auxiliary connection pattern 564. The bank 570 includes a first bank 572 of a hydrophilic property and a second bank 574 of a hydrophobic property. The bank 570 has a first opening 570a corresponding to the emission area EA1, EA2, and EA3 of each sub-pixel, a second opening 570c corresponding to the first transparent area TA1, and a third opening 570d corresponding to the second transparent area TA2.

At this time, the first bank 572 is formed between adjacent same color sub-pixels and between adjacent different color sub-pixels. On the other hand, the second bank 574 is formed only between the adjacent different color sub-pixels and exposes the first bank 572 disposed between the adjacent same color sub-pixels.

A light-emitting layer 580 is formed on the first electrode 160 exposed through the first opening 570a. The light-emitting layer 580 can include a first charge auxiliary layer 582, a light-emitting material layer 584, and a second charge auxiliary layer 586 that are sequentially positioned over the first electrode 160. The second charge auxiliary layer 586 is formed substantially over the entire surface of the substrate 100, and thus the second charge auxiliary layer 586 is also formed in the first and second transparent areas TA1 and TA2. The second charge auxiliary layer 586 can be formed on the second bank 574, the connection pattern 162, and the auxiliary connection pattern 564.

Here, the light-emitting layer 580 is also formed on the first bank 572 exposed between the adjacent same color sub-pixels, and the light-emitting layer 580 on the first bank 572 is connected to the light-emitting layer 580 on the first electrode 160 adjacent thereto, thereby forming one body.

At least the first charge auxiliary layer 582 and the light-emitting material layer 584 of the light-emitting layer 580 are formed through a solution process. Here, solutions dropped through different nozzles corresponding to the same color sub-pixel row are connected to each other, and the solutions are dried, thereby forming each of the first charge auxiliary layer 582 and the light-emitting material layer 584. Accordingly, the deviation in the dropping amounts between the nozzles is reduced or minimized, so that the thicknesses of thin films formed in respective sub-pixels can be uniformly formed.

Meanwhile, the second charge auxiliary layer 586 is formed through a thermal evaporation process. The second charge auxiliary layer 586 is formed substantially over the entire surface of the substrate 100 and is also disposed in the first and second transparent areas TA1 and TA2.

Next, the second electrode 590 is formed on the light-emitting layer 580. The first electrode 160, the light-emitting layer 580, and the second electrode 590 constitute a light-emitting diode De.

Here, the second electrode 590 is formed substantially over the entire surface of the substrate 100, more particularly, substantially all over a display area where the plurality of pixels P is provided. At this time, the second electrode 590 is formed in the whole pixel P excluding the first transparent area TA1. Accordingly, the second electrode 590 is not formed in the first transparent area TA1, and the second electrode 590 is formed in the emission area EA and the second transparent area TA2 and also formed between the emission area EA and the transparent area TA. The second electrode 590 is electrically connected to the connection pattern 162 and the auxiliary connection pattern 564.

Meanwhile, an anti-deposition layer 595 is formed on the overcoat layer 155 exposed in the first transparent area TA1. The anti-deposition layer 595 is formed through a solution process using an organic material. Accordingly, a height of the anti-deposition layer 595 in the region adjacent to the second bank 574 rise as it gets closer to the second bank 574, and the height of the anti-deposition layer 595 at an edge of the first transparent area TA1 is higher than the height of the anti-deposition layer 595 at a center of the first transparent area TA1

The anti-deposition layer 595 can be formed of one of materials represented by Formula Formulas 1 to 3.

The anti-deposition layer 595 exhibits a relatively low probability of initial fixation, thereby preventing the second electrode 590 from being formed in the first transparent area TA1. Accordingly, the transmittance of the first transparent area TA1 increases, so that the transmittance of the transparent area TA can increase. The thickness of the second electrode 590 adjacent to the first transparent area TA1 is thicker than the thickness of the second electrode 590 on the light-emitting layer 580 due to the anti-deposition layer 595.

As described above, in the transparent display device 5000 according to the fifth embodiment of the present disclosure, the light-emitting layers 580 of the same color sub-pixels are connected to each other and formed as one body, thereby reducing or minimizing the deviation in the dropping amounts between nozzles and uniformly forming the thicknesses of the light-emitting layers 580 of the respective sub-pixels.

In the embodiments of the present disclosure, it is described that the first auxiliary electrode 114 is provided as a line shape extending in the Y direction, but is not limited thereto. Alternatively, the first auxiliary electrode can be provided as a line shape extending in the X direction and be disposed between the emission area EA and the transparent area TA.

In the present disclosure, since each pixel includes the emission area and the transparent area, the surrounding environment information such as backgrounds can be shown through the transparent areas while displaying the image information through the emission areas.

In addition, the emission areas of the red, green and blue sub-pixels are configured to have the different sizes, the lifetimes of the light-emitting diodes provided at respective sub-pixels can be uniform, thereby improving the lifetime of the transparent display device.

Further, by forming at least a part of the light-emitting layer through the solution process, the fine metal mask can be omitted to thereby reduce the manufacturing costs, and a display device with a large size and high definition can be implemented.

Additionally, the anti-deposition layer is formed in the first transparent area so that the second electrode is prevented from being deposited in the first transparent area, thereby improving the transmittance of the transparent area.

Moreover, the transparent display device is implemented as the top emission type to thereby increase the luminance and reduce the power consumption. At this time, the second electrode is electrically connected to the auxiliary electrode through the connection pattern, so that the resistance of the second electrode is lowered. Additionally, the second electrode is also electrically connected to the auxiliary connection pattern of the second transparent area, thereby improving the electrical contact property between the second electrode and the connection pattern.

It will be apparent to those skilled in the art that various modifications and variations can be made in a device of the present disclosure without departing from the sprit or scope of the embodiments. Thus, it is intended that the present disclosure covers the modifications and variations of this invention provided they come within the scope of the appended claims and their equivalents.

What is claimed is:

1. A transparent display device comprising:
   a substrate on which a pixel including an emission area and a first transparent area is defined;
   a light-emitting diode provided in the emission area and including a first electrode, a light-emitting layer, and a second electrode; and
   an anti-deposition layer provided in the first transparent area,
   wherein a height of the light-emitting layer at an edge area of the emission area is higher than a height of the light-emitting layer at a center area of the emission area,
   wherein the second electrode is disposed over an entire surface of the substrate excluding the first transparent area, and
   wherein a height of the anti-deposition layer at an edge area of the first transparent area is higher than a height of the anti-deposition layer at a center area of the first transparent area.

2. The transparent display device of claim 1, wherein the pixel further includes a second transparent area, and
   a transmittance of the first transparent area is higher than a transmittance of the second transparent area.

3. The transparent display device of claim 2, wherein the second electrode is also disposed in the second transparent area.

4. The transparent display device of claim 3, further comprising:
   a connection pattern provided between the emission area and the second transparent area and formed of a same material and on a same layer as the first electrode; and
   an auxiliary connection pattern provided in the second transparent area and connected to the connection pattern,
   wherein the second electrode overlaps and is electrically connected to the connection pattern and the auxiliary connection pattern.

5. The transparent display device of claim 4, wherein the auxiliary connection pattern overlaps and contacts the connection pattern.

6. The transparent display device of claim 4, wherein each of the first electrode and the connection pattern includes a first layer, a second layer, and a third layer, and
   the auxiliary connection pattern and the first layer of the connection pattern are formed as one body.

7. The transparent display device of claim 6, wherein the second layer is disposed between the first layer and the third layer, and
   the first layer is disposed between the substrate and the second layer.

8. The transparent display device of claim 6, wherein the second layer is disposed between the first layer and the third layer, and
   the third layer is disposed between the substrate and the second layer.

9. The transparent display device of claim 4, wherein the light-emitting layer includes a first charge auxiliary layer, a light-emitting material layer, and a second charge auxiliary layer, and
   the second charge auxiliary layer is disposed between the second electrode and the connection pattern and between the second electrode and the auxiliary connection pattern.

10. The transparent display device of claim 4, further comprising at least one auxiliary electrode between the substrate and the connection pattern,
    wherein the second electrode is electrically connected to the at least one auxiliary electrode through the connection pattern and the auxiliary connection pattern.

11. The transparent display device of claim 4, further comprising a bank having a first opening, a second opening, a third opening, and an auxiliary contact hole,
    wherein the first opening corresponds to the emission area, the second opening corresponds to the first transparent area, the third opening corresponds to the second transparent area, and the auxiliary contact hole corresponds to the connection pattern.

12. The transparent display device of claim 11, wherein the bank includes a first bank having a hydrophilic property and a second bank having a hydrophobic property.

13. The transparent display device of claim 12, wherein the first bank and the second bank are formed as one body.

14. The transparent display device of claim 1, wherein the emission area and the first transparent area are arranged along a first direction, and
    the emission area includes a first emission area, a second emission area, and a third emission area arranged along a second direction substantially perpendicular to the first direction.

15. The transparent display device of claim 1, wherein the emission area and the first transparent area are arranged along a first direction, and
    the emission area includes a first emission area, a second emission area, and a third emission area arranged along the first direction.

16. The transparent display device of claim 15, wherein the light-emitting layers of emission areas adjacent to each other along a second direction substantially perpendicular to the first direction are connected to each other to form one body.

17. The transparent display device of claim 1, further comprising at least one thin film transistor between the substrate and the first electrode,
    wherein the first electrode is connected to the at least one thin film transistor.

18. The transparent display device of claim 1, wherein the anti-deposition layer is formed of one of materials respectively represented by Formulas 1 to 3, Formula 1

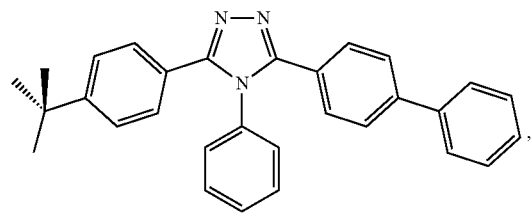

Formula 2

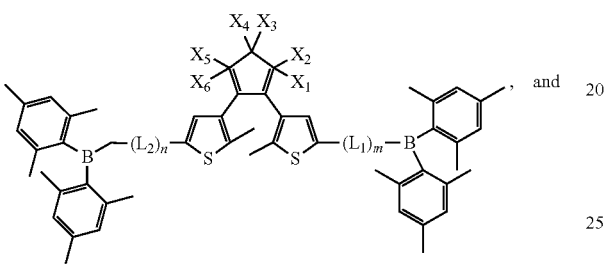
and

Formula 3

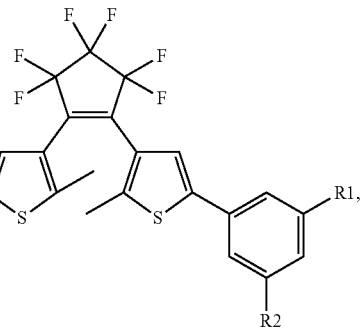

wherein in the Formula 2, each of $L_1$ and $L_2$ is aryl or heteroaryl, each of m and n is 0 or 1, and each of $X_1$ to $X_6$ is independently selected from a hydrogen or halogen atom, and wherein in the Formula 3, each of R1 to R4 is independently selected from a heteroaromatic group containing a nitrogen atom.

19. The transparent display device of claim 1, wherein a thickness of the second electrode adjacent to the anti-deposition layer is thicker than a thickness of the second electrode on the light-emitting layer.

* * * * *